(12) United States Patent
Hamidovic et al.

(10) Patent No.: US 10,587,354 B1
(45) Date of Patent: Mar. 10, 2020

(54) MULTIPHASE TRANSMITTER DIGITAL FRONT END

(71) Applicant: Intel Corporation, Santa Clara, CA (US)

(72) Inventors: Damir Hamidovic, Linz (AT); Tobias Buckel, Linz (AT); Alexander Klinkan, Linz (AT); Franz Kuttner, St. Ulrich (AT); Jovan Markovic, Linz (AT); Peter Preyler, Weyer (AT)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/200,126

(22) Filed: Nov. 26, 2018

(51) Int. Cl.
*H04B 17/354* (2015.01)
*H04L 27/26* (2006.01)
*H04L 27/36* (2006.01)
*H04B 1/04* (2006.01)

(52) U.S. Cl.
CPC ......... *H04B 17/354* (2015.01); *H04B 1/0475* (2013.01); *H04L 27/2695* (2013.01); *H04L 27/364* (2013.01)

(58) Field of Classification Search
CPC .................................................. H04B 17/354
USPC ........................................................ 375/296
See application file for complete search history.

(56) References Cited

U.S. PATENT DOCUMENTS

| | | | |
|---|---|---|---|
| 7,046,738 B1 * | 5/2006 | Dent ................. | H04L 25/03834 332/103 |
| 9,413,394 B1 * | 8/2016 | Lye ........................ | H03M 1/662 |
| 9,722,645 B2 | 8/2017 | Markovic | |
| 2005/0258992 A1 * | 11/2005 | Fontaine ............... | H03M 1/662 341/144 |
| 2009/0073013 A1 * | 3/2009 | Pozsgay ................ | H03M 1/745 341/144 |
| 2013/0002472 A1 * | 1/2013 | Crouch ................... | G01S 17/66 342/97 |

OTHER PUBLICATIONS

Wen Yuan et.al. "A Multiphase Switched Capacitor Power Amplifier", IEEE Journal of Solid-State Circuits, vol. 52, No. 5, May 2017.

* cited by examiner

*Primary Examiner* — Lihong Yu
(74) *Attorney, Agent, or Firm* — Schiff Hardin LLP

(57) ABSTRACT

Techniques are disclosed to provide a data dependent delay for a multi-phase transmitter architectures. These techniques include identifying a current segment occupied by a symbol associated with in-phase (I) and quadrature phase (Q) data within a data constellation based upon the number of phases used. Once the segment is identified, vector components are calculated as a function of the segment used to re-map the symbol within the constellation defined in accordance with the number of phases. The data delay may be performed in the baseband or at the RF rate to time-align local oscillator clocks with the delayed data, which is represented as the calculated vector components, for transmission. Further modifications to the RF-DAC operation to facilitate operation with the multi-phase system are also disclosed.

24 Claims, 19 Drawing Sheets
(13 of 19 Drawing Sheet(s) Filed in Color)

300

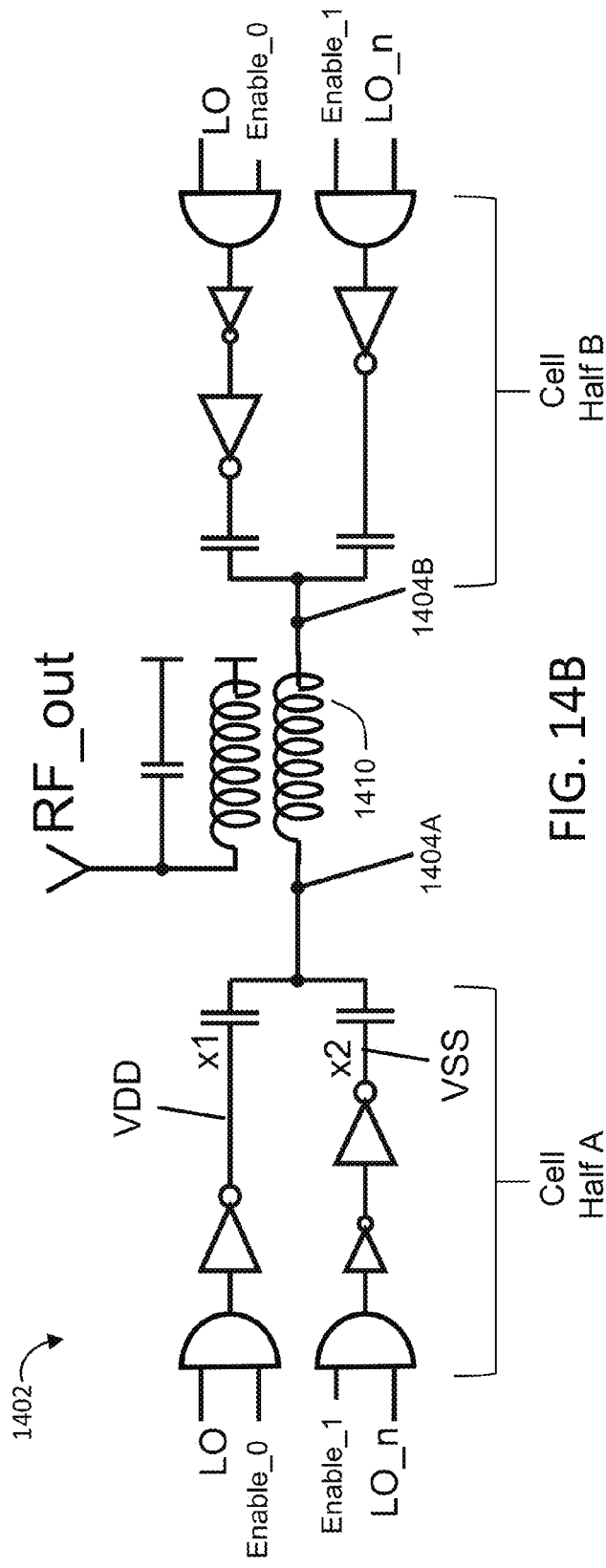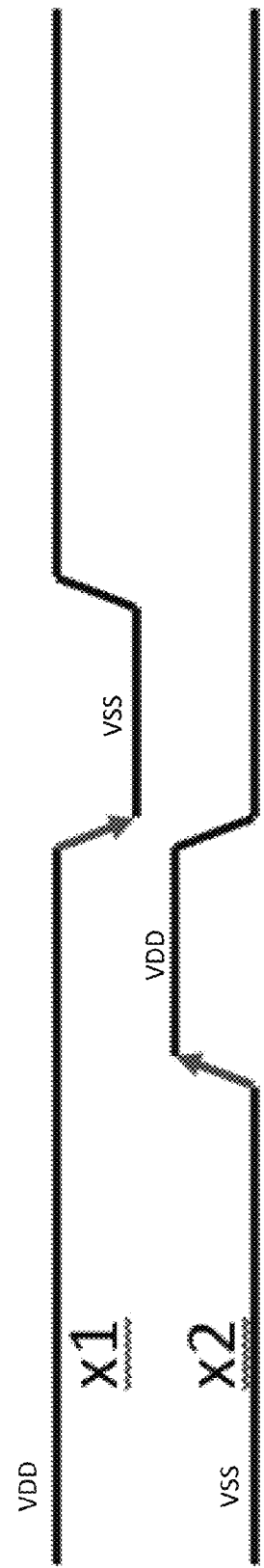
FIG. 14B
FIG. 14C

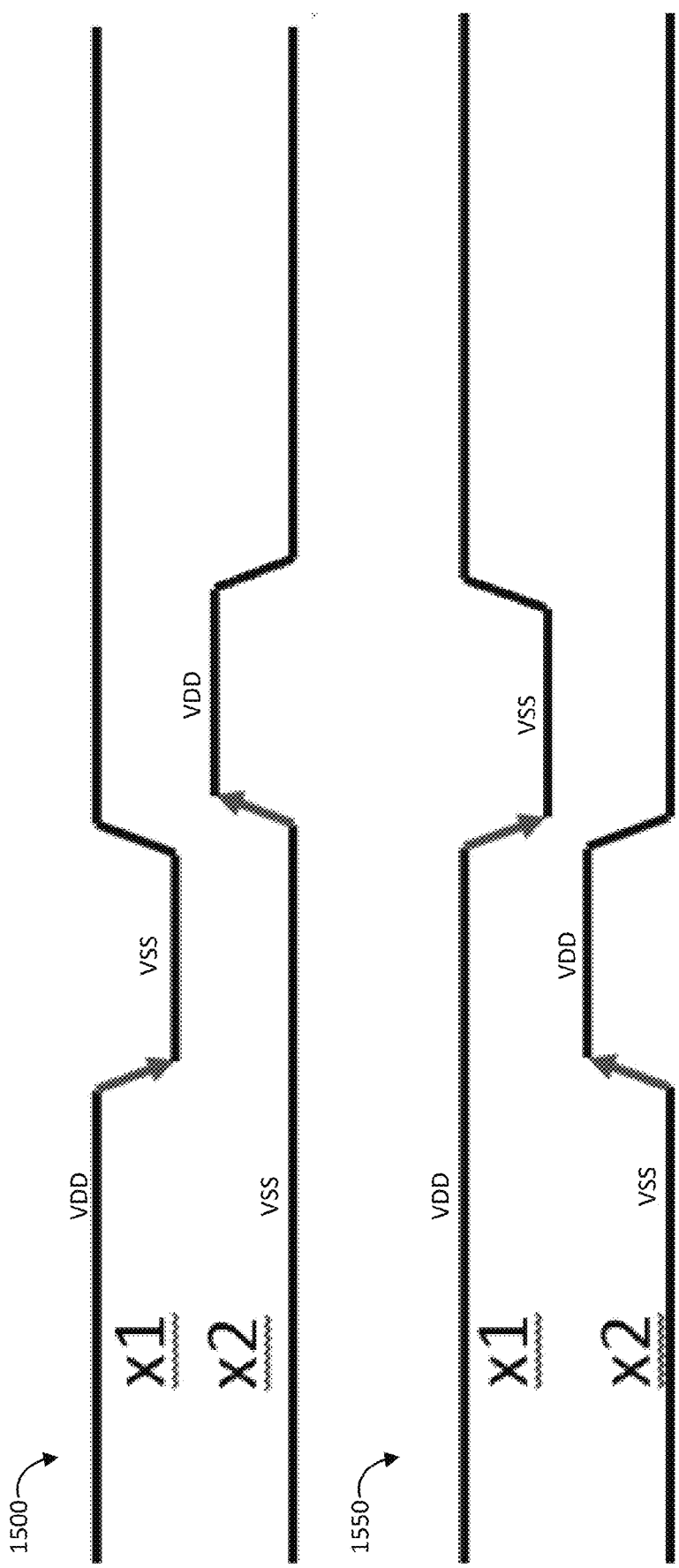

US 10,587,354 B1

MULTIPHASE TRANSMITTER DIGITAL FRONT END

TECHNICAL FIELD

Aspects described herein generally relate to digital front ends for radio frequency (RF) transmitters and, more particularly, to multiphase transmitter designs implementing data-dependent delay adjustment and multiphase RF digital-to-analog converters (RF-DACs) that compensate for such delays.

BACKGROUND

Quadrature transmitter architectures have a reduced output power and efficiency due to a combination of the out-of-phase signals. To remedy this, multiphase architectures have been developed that increase the number of phases beyond the typical four used for quadrature architectures, thereby reducing the phase difference between the combined basis vectors that represent the baseband in-phase (I) and quadrature phase (Q) data. These traditional multiphase transmitter architectures, however, are unable to achieve spectral purity, especially with regards to adjacent channel leakage ratio (ACLR) performance, and therefore are not sufficient for the stringent demands of modern cellular communication standards such as LTE, LTE-CA, 5G NR, etc.

BRIEF DESCRIPTION OF THE DRAWINGS/FIGURES

The patent or application file contains at least one drawing executed in color. Copies of this patent or patent application publication with color drawing(s) will be provided by the Office upon request and payment of the necessary fee.

The accompanying drawings, which are incorporated herein and form a part of the specification, illustrate the aspects of the present disclosure and, together with the description, further serve to explain the principles of the aspects and to enable a person skilled in the pertinent art to make and use the aspects.

Figure 4A:
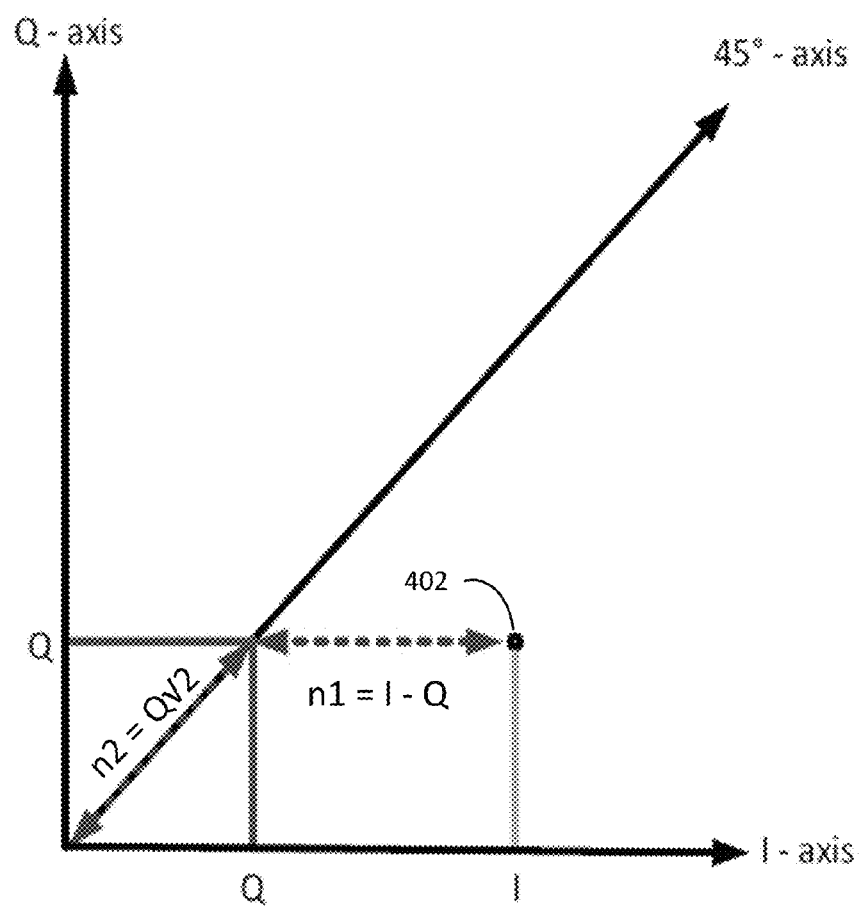
FIG. 4A is an example diagram 400 showing the calculation of vector components n1, n2, for an 8-phase system, in accordance with an aspect of the disclosure.
Figures 4B, 4C:
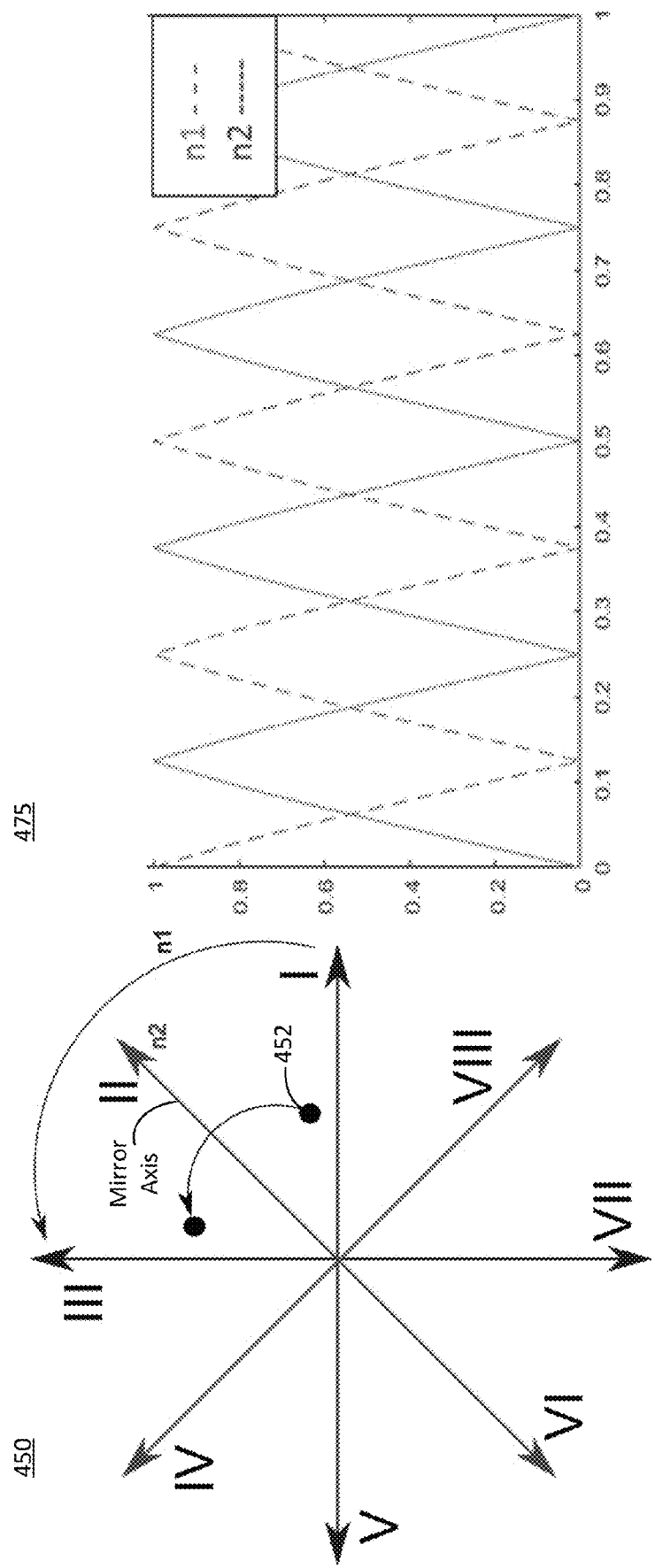
FIG. 4B is an example diagram 450 demonstrating the mirroring principle corresponding to an 8-phase system, in accordance with an aspect of the disclosure.

FIG. 4C is an example diagram 475 of an example graph demonstrating the change in magnitude of the components n1 and n2 for an IQ data point of a constant magnitude as the phase angle changes between 0 and 360 degrees, in accordance with an aspect of the disclosure.

Figure 5:
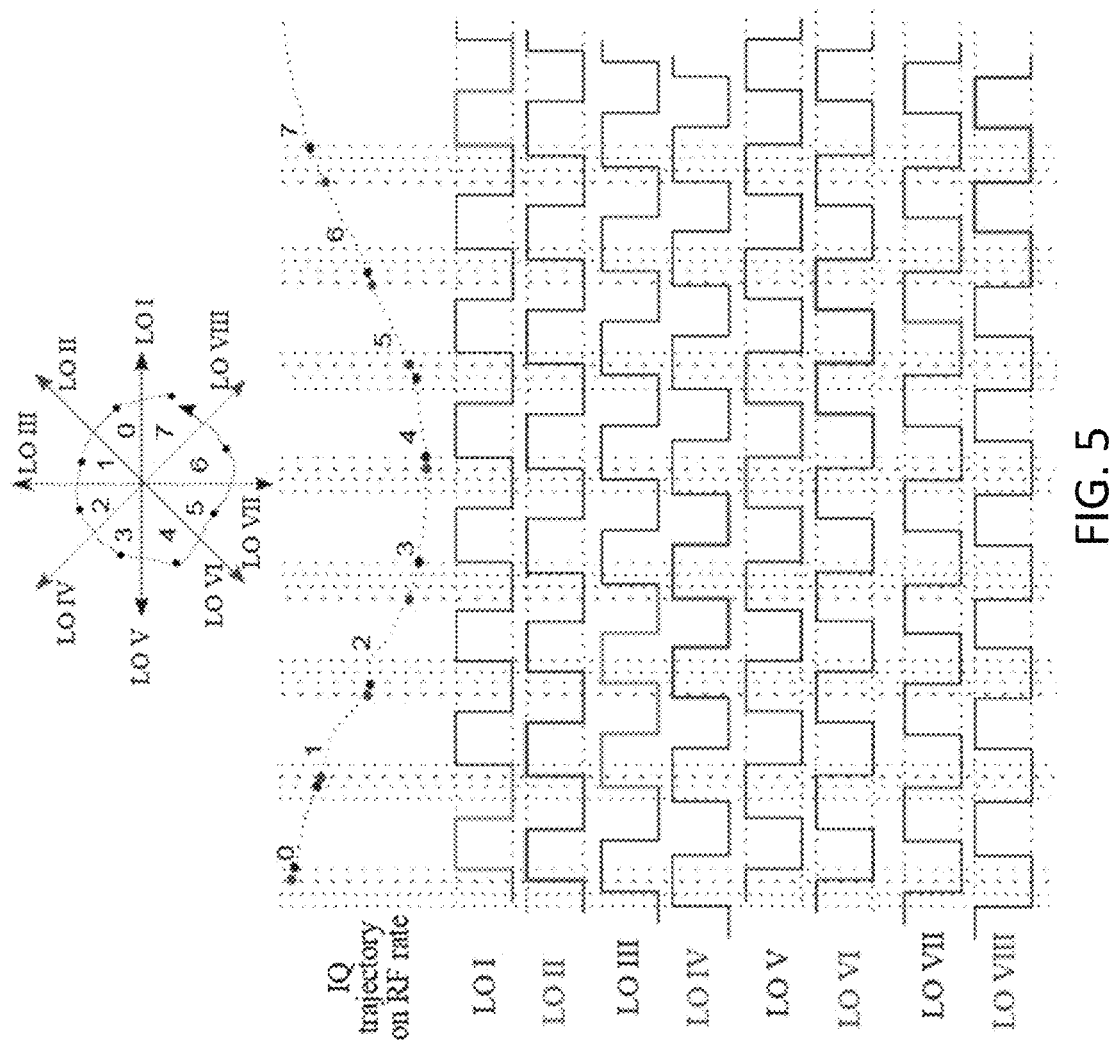

FIG. 5 is an example diagram 500 illustrating active local oscillator (LO) clocks used in accordance with an 8-phase transmitter system that tracks the I/Q trajectory on the RF rate, in accordance with an aspect of the disclosure.

Figure 6:
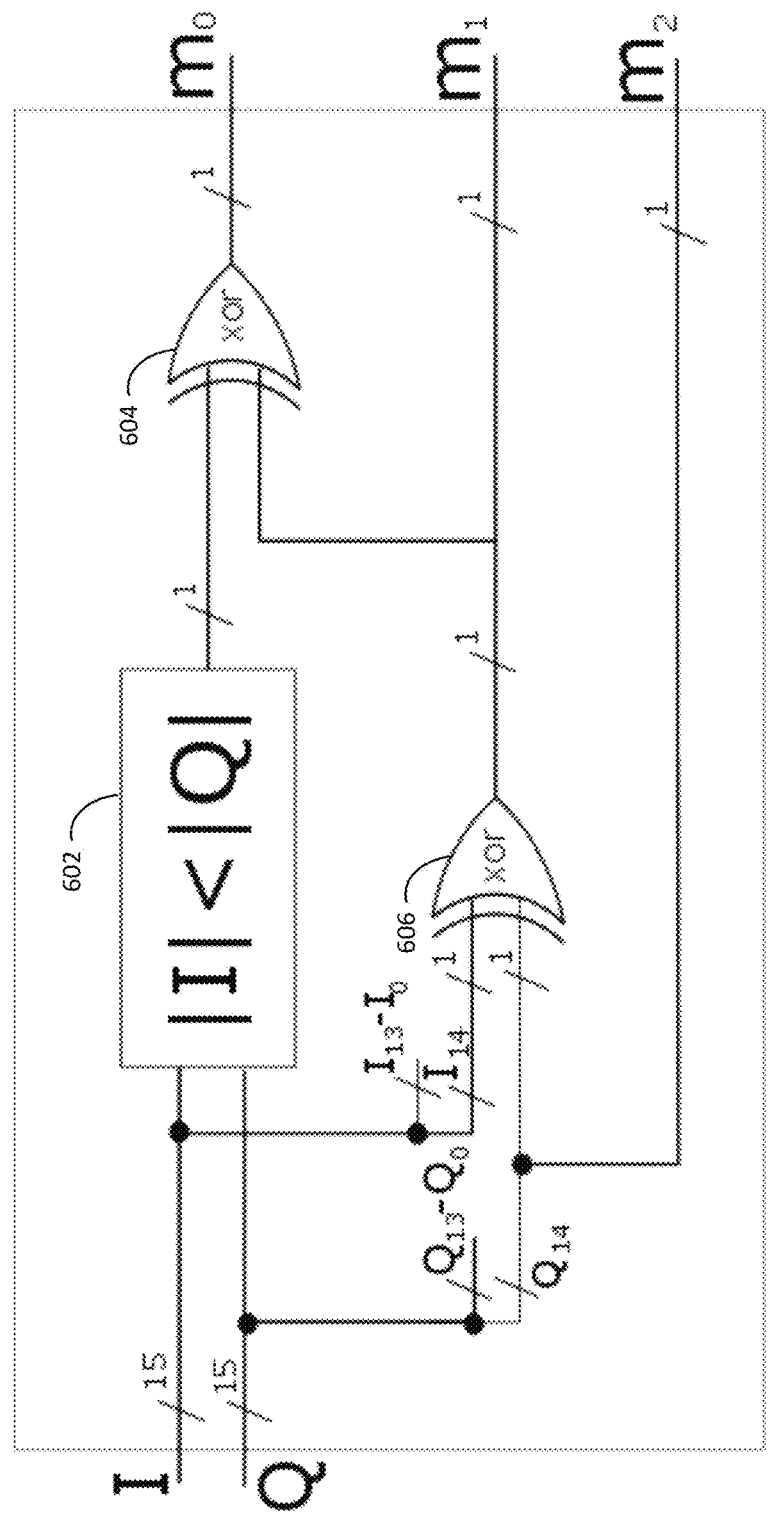

FIG. 6 is an example segment calculation block 600, in accordance with an aspect of the disclosure.

Figure 7:
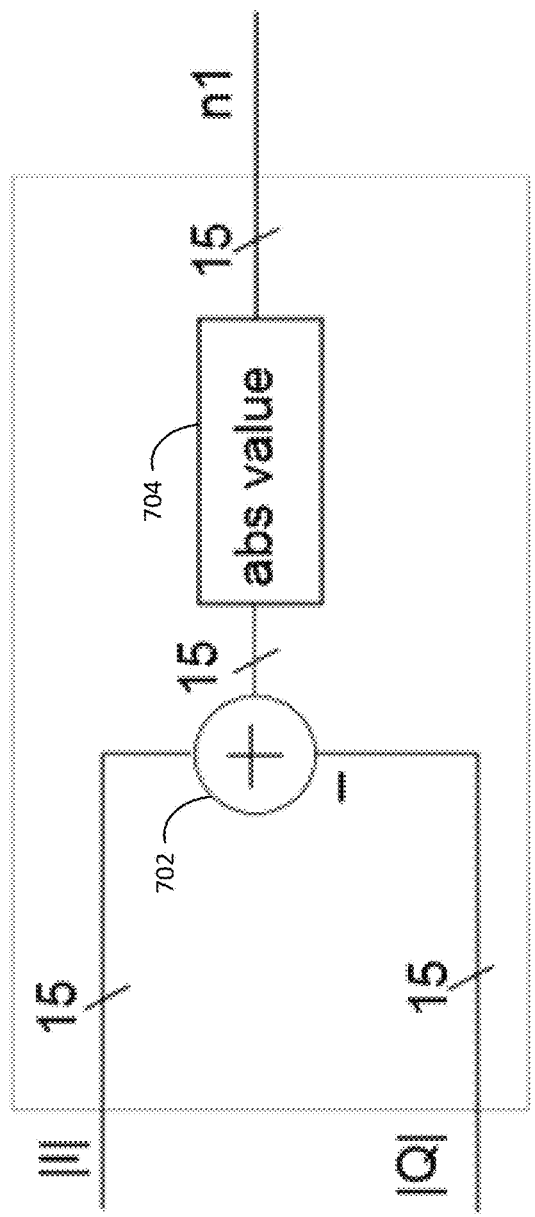

FIG. 7 is an example n1 component calculation block 700, in accordance with an aspect of the disclosure.

Figure 8:
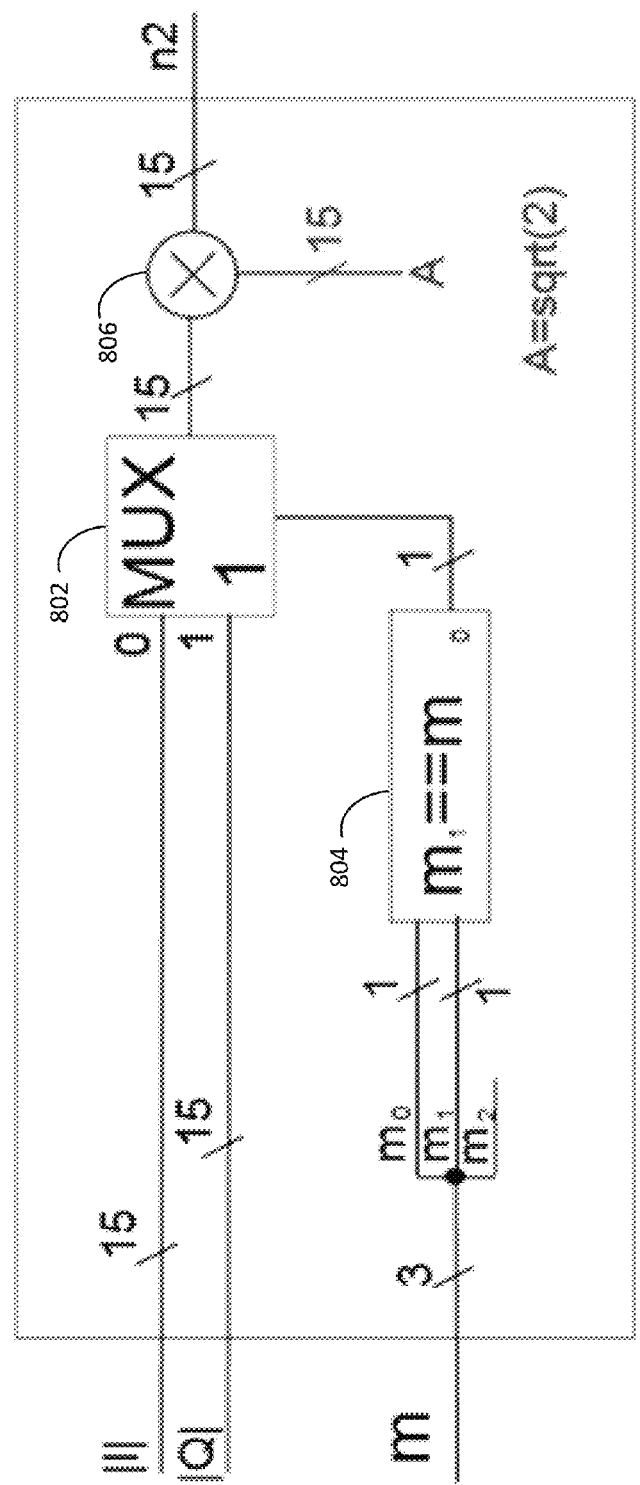

FIG. 8 is an example n2 component calculation block 800, in accordance with an aspect of the disclosure.

Figure 9:
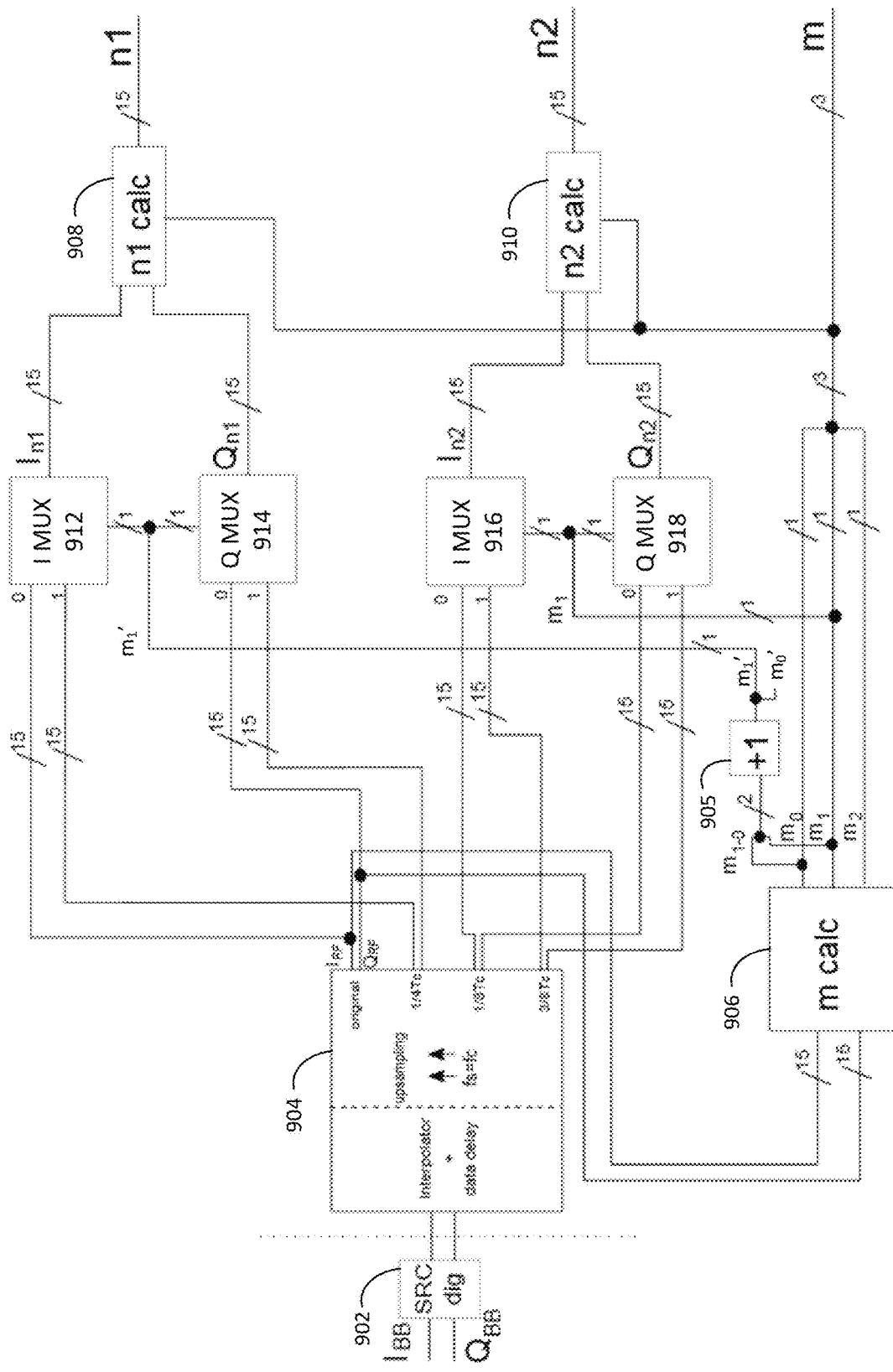

FIG. 9 is an example digital front end (DFE) 900 implementing data delay at the baseband rate, in accordance with an aspect of the disclosure.

Figure 10:
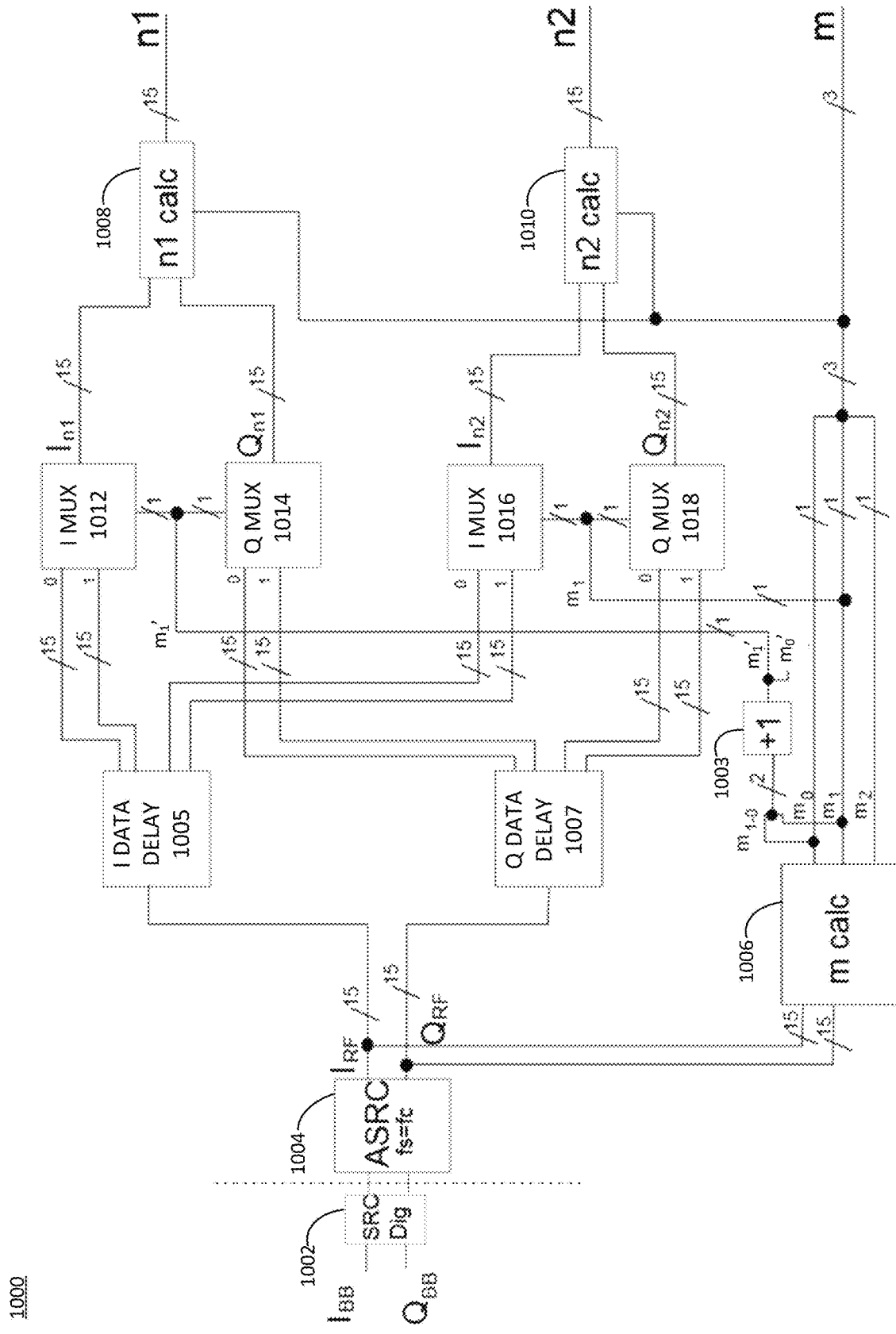

FIG. 10 is an example DFE 1000 implementing data delay at the RF rate, in accordance with an aspect of the disclosure.

Figure 11:
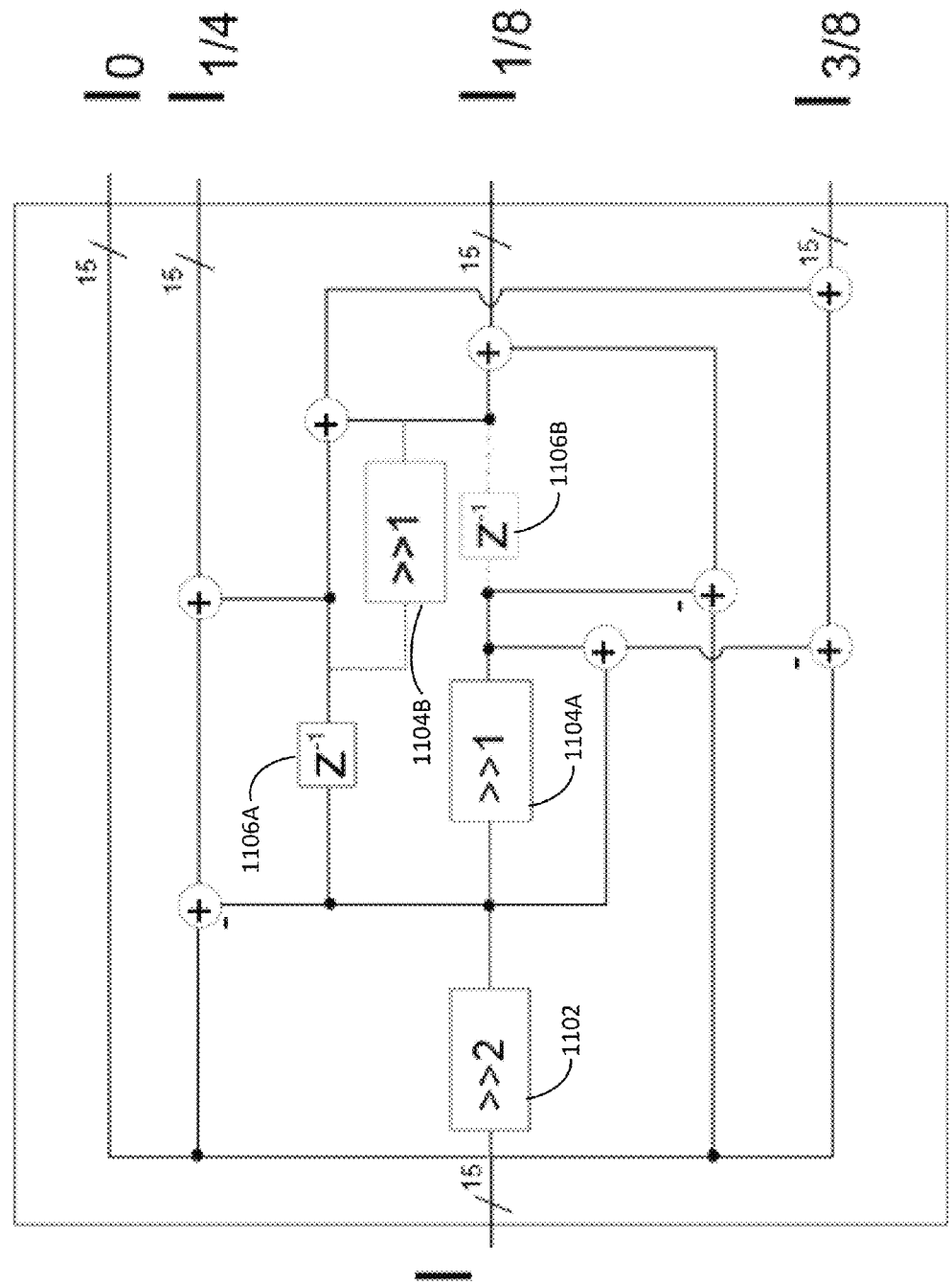

FIG. 11 is an example data delay block 1100 implemented by the DFE 1000, in accordance with an aspect of the disclosure.

Figure 12:
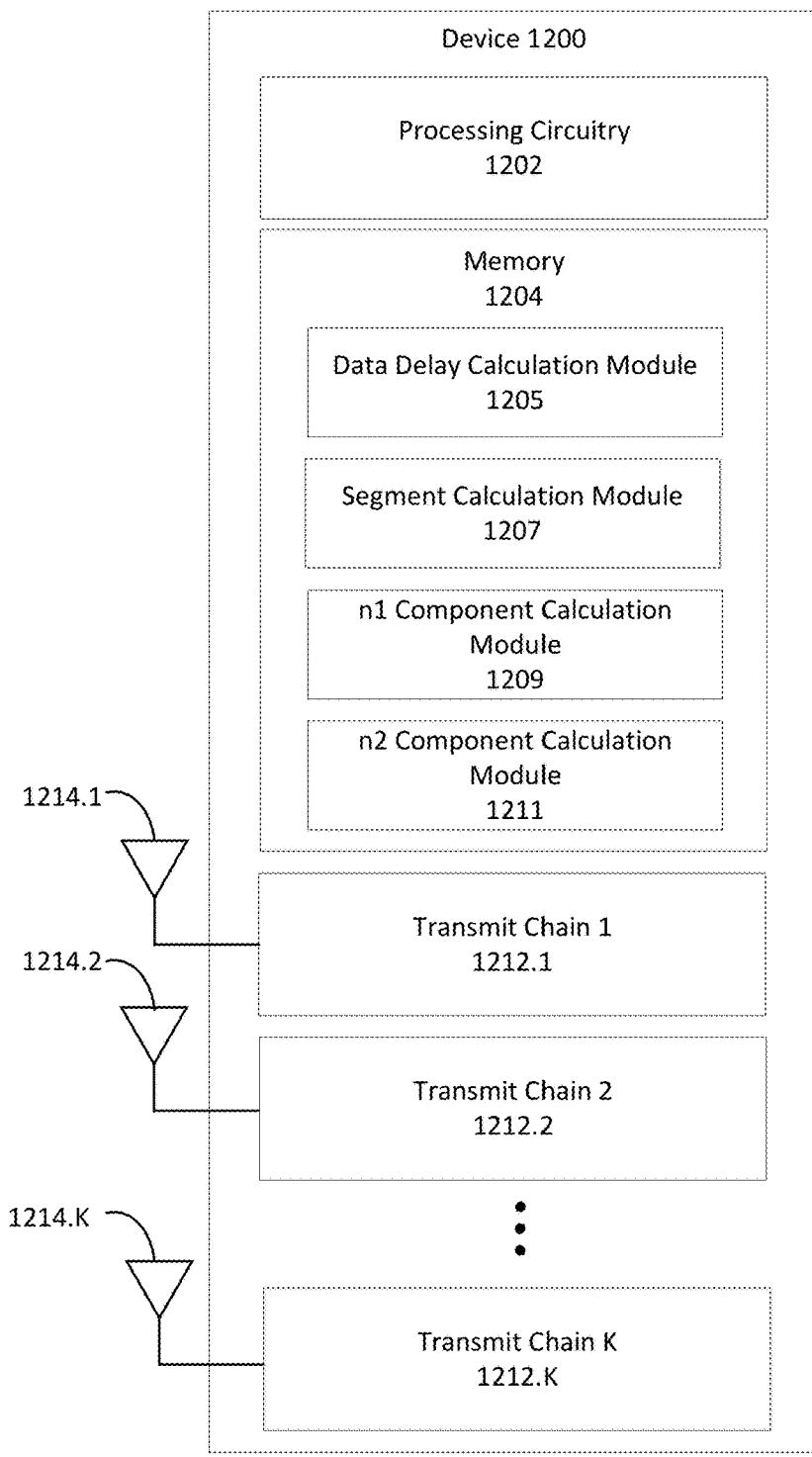

FIG. 12 illustrates a block diagram of a device, in accordance with an aspect of the disclosure.

Figure 13:
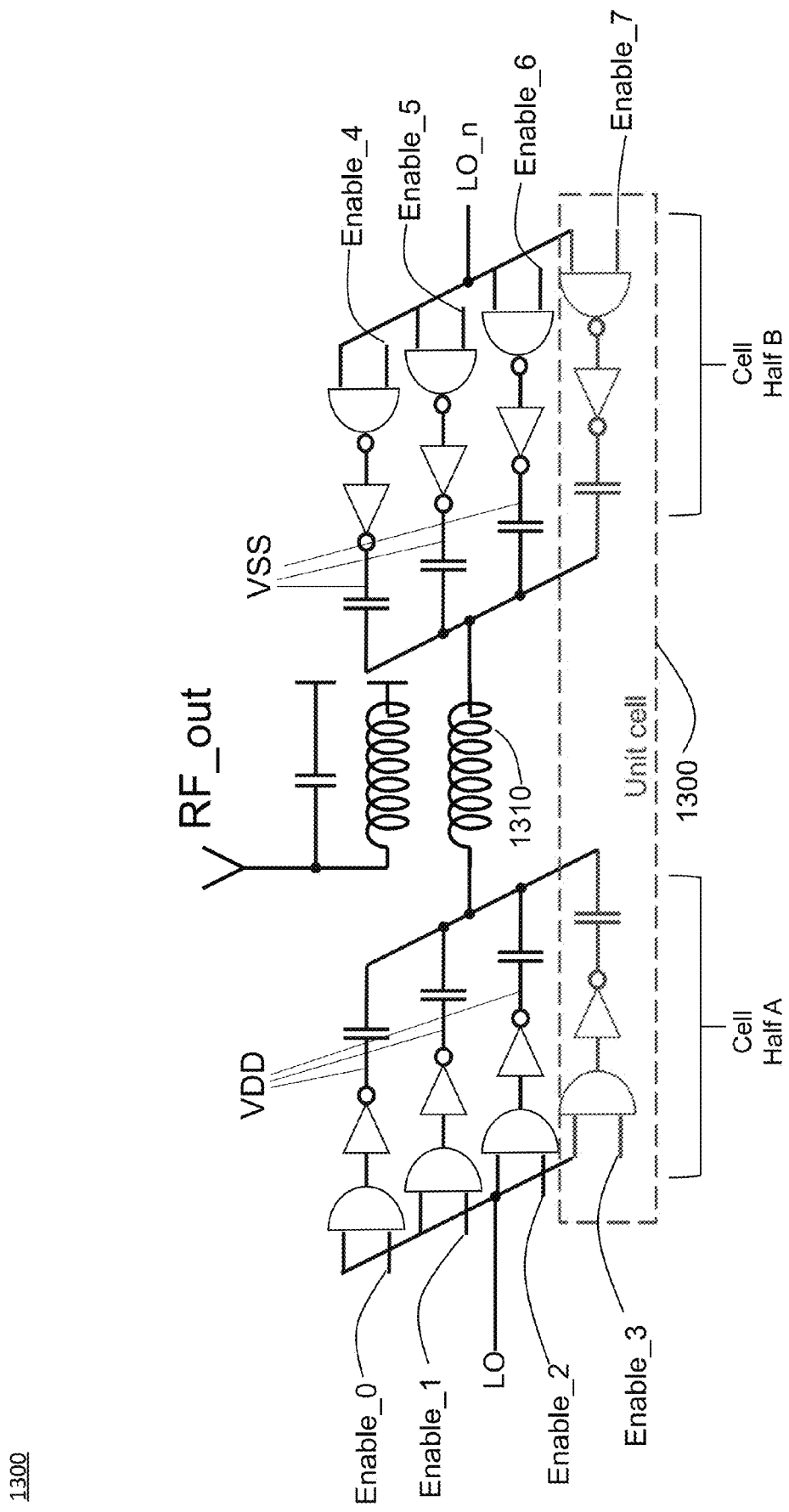

FIG. 13 illustrates a schematic of an RF-DAC with unit cells, in accordance with an aspect of the disclosure.

Figure 14A:
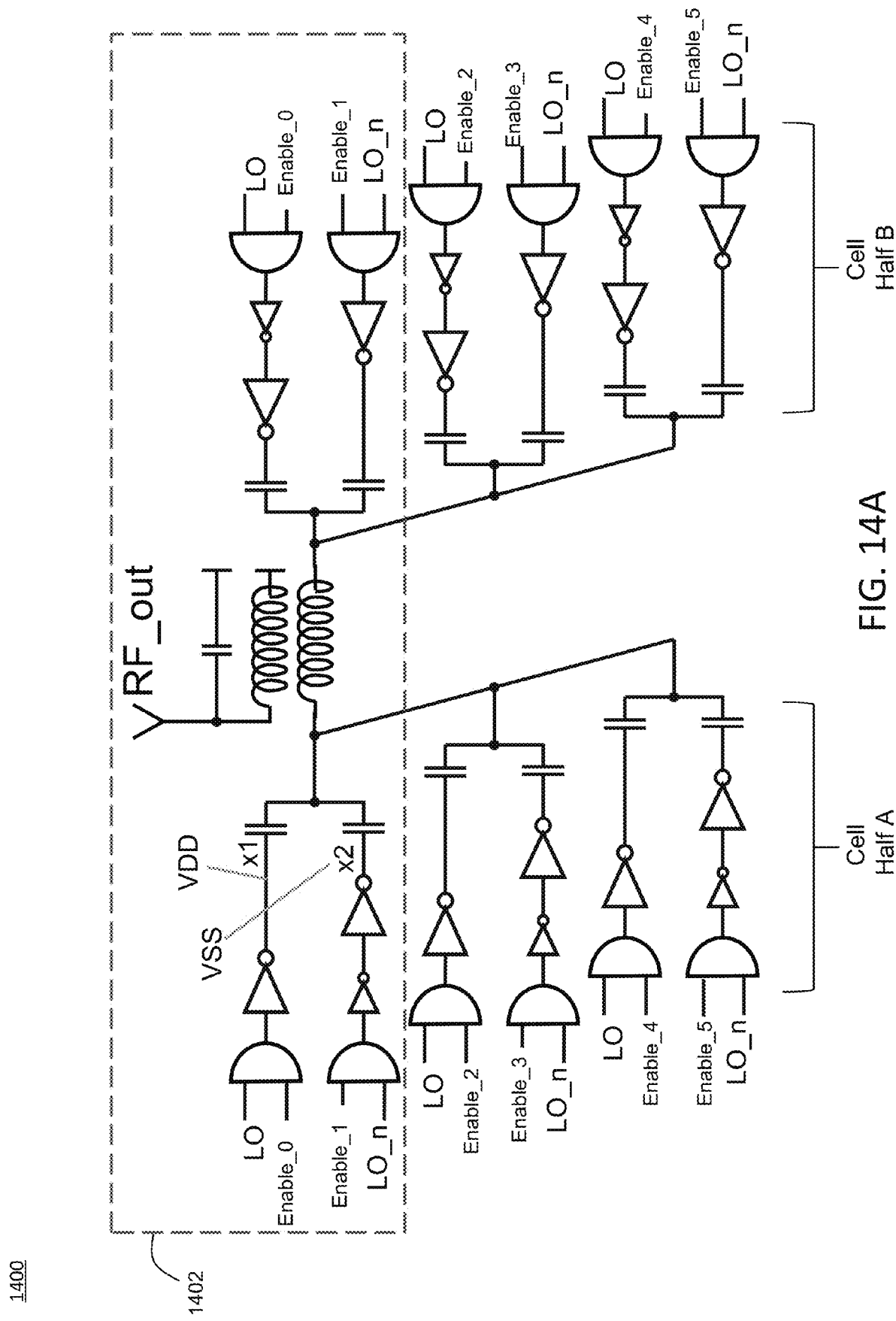

FIG. 14A illustrates a schematic of an RF-DAC, in accordance with an aspect of the disclosure.

FIG. 14B illustrates a schematic of an RF-DAC unit cell, in accordance with an aspect of the disclosure.

FIG. 14C shows an example timing diagram indicating the voltage at nodes X1 and X2 of an RF-DAC unit cell, in accordance with an aspect of the disclosure.

FIG. 15 shows two example timing diagram for two sets of signals corresponding to the RF-DAC unit cell 1402 being enabled for different sets of data, in accordance with an aspect of the disclosure.

Figure 16B:
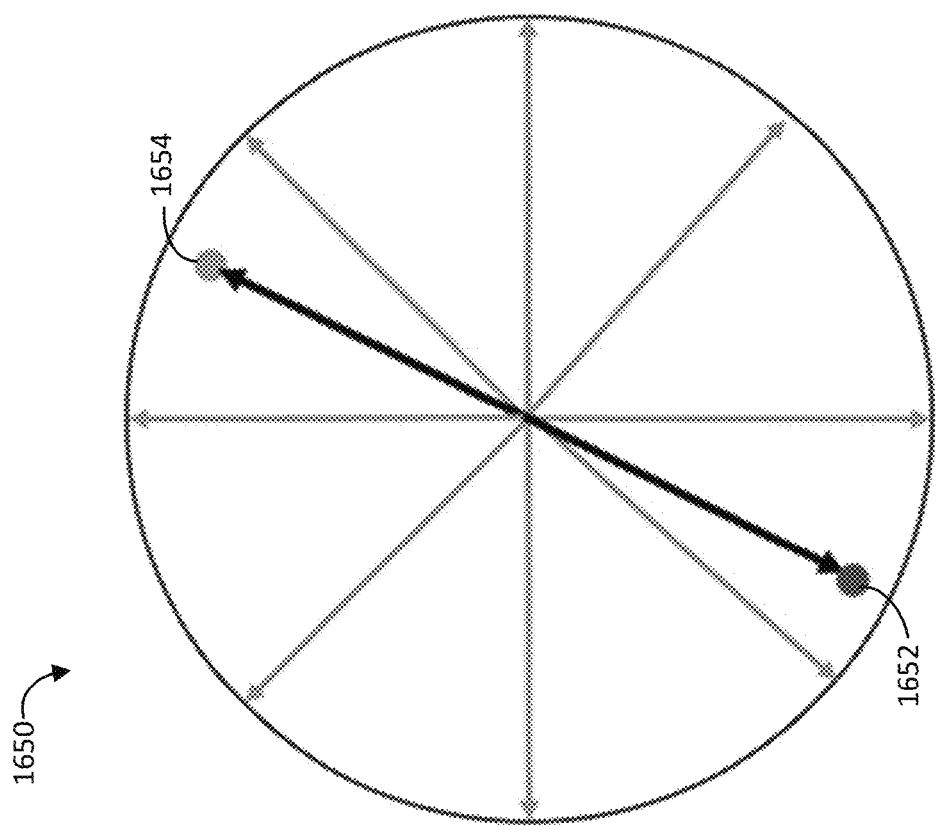
Figure 16A:
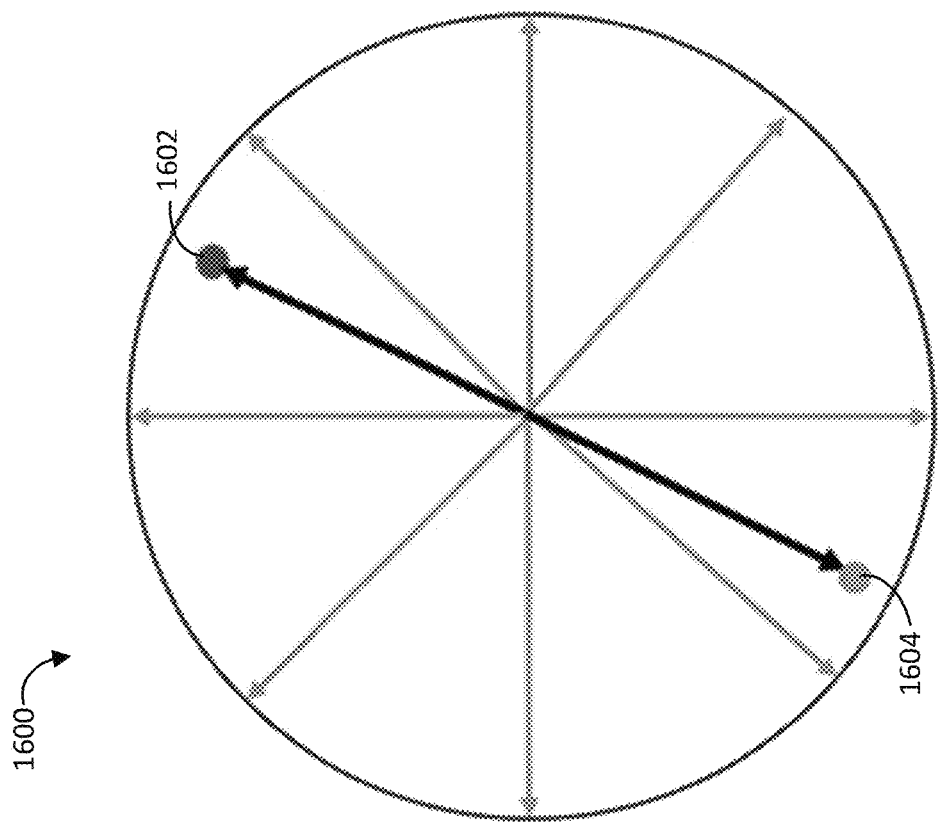

FIG. 16A shows a data point and an accompanying 180-degree out-of-phase data point associated with the sets of signals 1500 shown in FIG. 15, in accordance with an aspect of the disclosure.

FIG. 16B shows a data point and an accompanying 180-degree out-of-phase data point associated with the sets of signals 1550 shown in FIG. 15, in accordance with an aspect of the disclosure.

Figure 17:
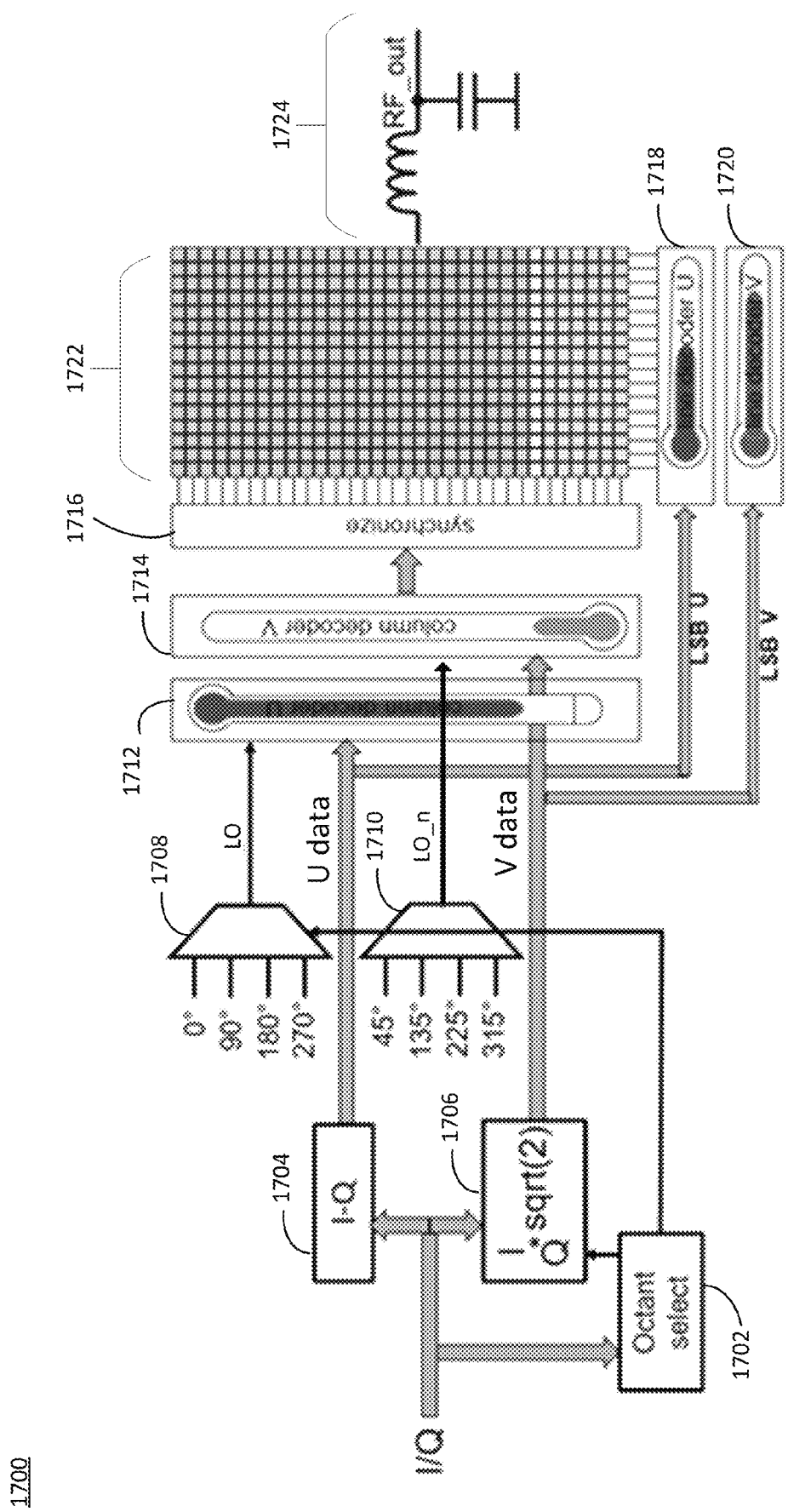

FIG. 17 illustrates an example multiphase transmitter architecture with data-dependent delay adjustment, in accordance with an aspect of the disclosure.

The exemplary aspects of the present disclosure will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the aspects of the present disclosure. However, it will be apparent to those skilled in the art that the aspects, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

Typical multiphase (MP) transmitter architectures may be unable to meet the regulatory performance requirements of cellular communication standards. The major limiting factor of MP transmitter designs is the lack of data-delay adjustment. Therefore, to remedy this issue, the first portion of this application is directed to a digital-front-end (DFE) architecture for a MP transmitter that implements a data-dependent delay adjustment for improved transmitter performance, allowing such MP transmitter designs to comply with the strict requirements on in-band distortion and out-of-band spectral emission associated with certain wireless communication standards such as LTE, LTE-A, 5G NR, etc. This DFE architecture results in significantly improved out-of-band spectrum (especially ACLR) compared to conventional MP transmitter architectures that do not utilize utilizing data-delay adjustments. These aspects also significantly improve upon the spectrum and/or power efficiency performance compared to conventional MP transmitter architectures.

The second portion of this application is directed to a further refinement of the data dependent delay architecture. In particular, the second portion is directed to aspects that leverage the radio-frequency digital-to-analog converter (RFDAC) design to simplify the calculations used to implement the data-dependent delay DFE design discussed in the first portion of the application.

Digital Front End with Data Dependent Delay Adjustment

Figure 1:
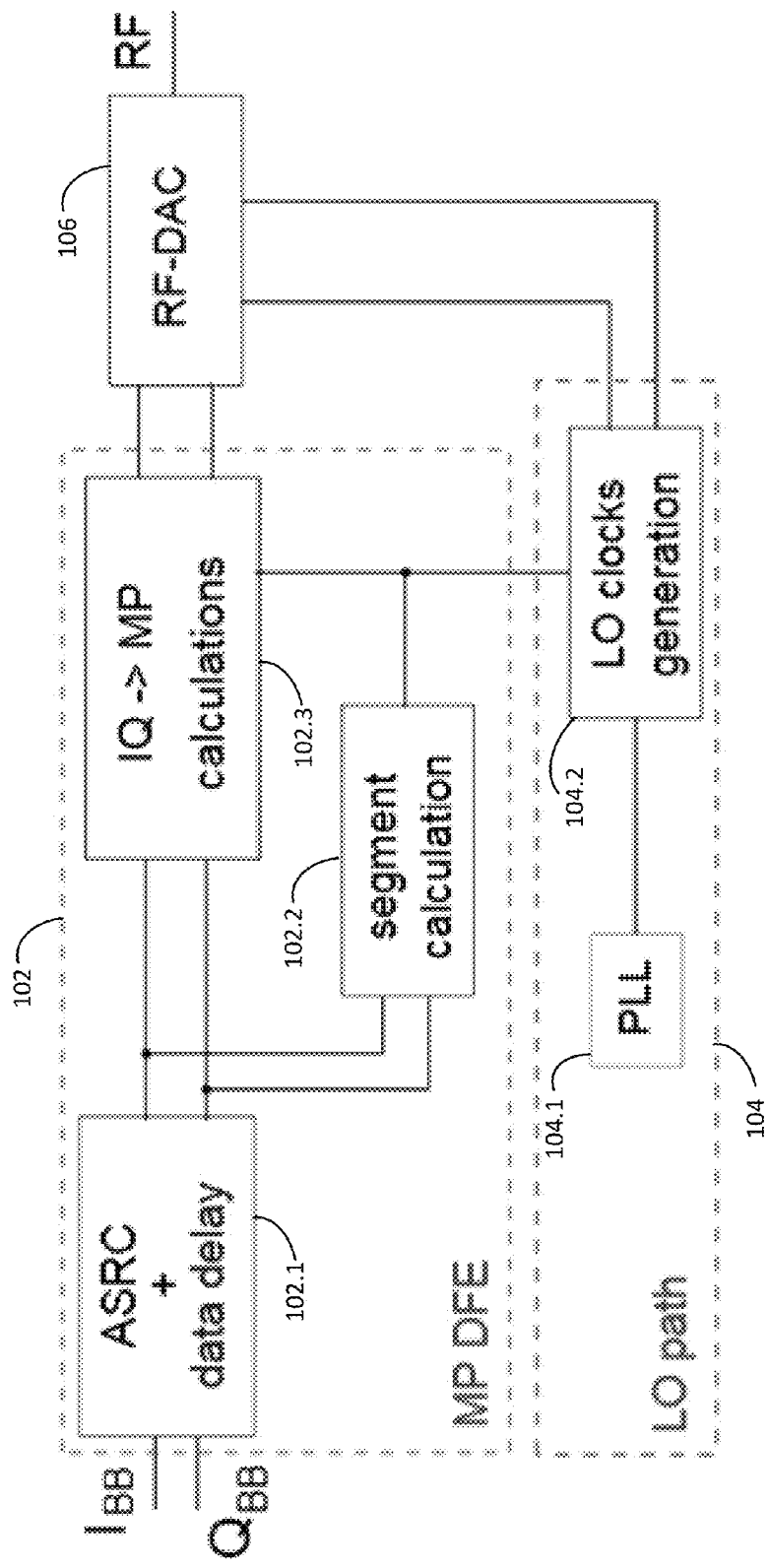
FIG. 1 illustrates a block diagram 100 of an exemplary multiphase transmitter architecture with data-dependent delay adjustment, in accordance with an aspect of the disclosure.

FIG. 1 illustrates a block diagram of an example multi-phase transmitter architecture with data-dependent delay adjustment, in accordance with an aspect of the disclosure. The transmitter architecture 100 as shown in FIG. 1 may generally include a MP-DFE 102, a local oscillator path 104, and an RF-DAC block 106. In an aspect, the transmitter architecture 100 may be associated with an individual RF transmit chain that forms a portion of an overall transmitter design. Thus, the actual overall transmitter in which the transmitter architecture 100 is implemented may include any suitable number of RF transmit chains, each being coupled to one or more respective antennas. In accordance with various aspects, the transmitter architecture 100 may have additional or alternate components that have been omitted for brevity and ease of explanation.

In an aspect, the local oscillator (LO) path 104 may include a phased-locked loop (PLL) 104.1 that is coupled to a LO clock generation block 104.2. The PLL may be implemented as any suitable type of hardware and/or software components configured to provide a stable, synthesized reference frequency to the LO clock generation block 104.2. For instance, the PLL 104.1 may be implemented as a digital phase-locked loop (DPLL) that is configured to generate a synthesized frequency signal that is received via the LO clock generation block 104.2.

In an aspect, the LO clock generation block 104.2 may be configured to phase-shift the synthesized frequency signal generated by the PLL 104.1 and to generate any suitable number of phase-shifted output clocks. Aspects include the LO clock generation block 104.2 being implemented as any suitable type of hardware and/or software to provide the desired number of phase-shifted clock signals. For instance, the LO clock generation block 104.2 may be implemented as any suitable number of delay elements (e.g., inverters and/or buffers) in series in accordance with known techniques, with one or more taps coupled between adjacent delay elements to provide delayed (i.e., phase-shifted) versions of the synthesized frequency signal generated by the PLL 104.1.

In additional aspects, the LO signal may be derived not only based on delay elements but also by divisions (e.g., such as those done using a counter), via interpolation (which can be weighted), as well as combinations of such techniques (including the aforementioned use of delay elements). To provide an illustrative example, the use of a weighted interpolation to generate LO signals may implement a known technique implementing two configurable current sources that together load a capacitance. These two current sources may be driven by a clock signal and a delayed version of the clock signal. A coupled output stage may then be triggered to generate an output upon a threshold voltage level being reached.

Thus, aspects include the LO clock generation block implementing any suitable number and/or type of components (e.g., components in accordance with the aforementioned implementations and/or switches, selector blocks, etc.) so as to facilitate the generation of LO clock signals using configurable phase shifting. As further disused below, the LO clock generation block 104.2 may selectively output a pair of phase-shifted clock signals based upon the particular segment of the constellation map in which the delayed I/Q data presently resides. To do so, aspects include the number of phase-shifted output clocks generated by the LO clock generation block 104.2 being equal to the desired number of phases (and thus segments) utilized by the multi-phase transmitter architecture 100. For example, the LO clock generation block 104.2 may generate 4, 8, 16, 32 clocks, etc.

Figure 2:
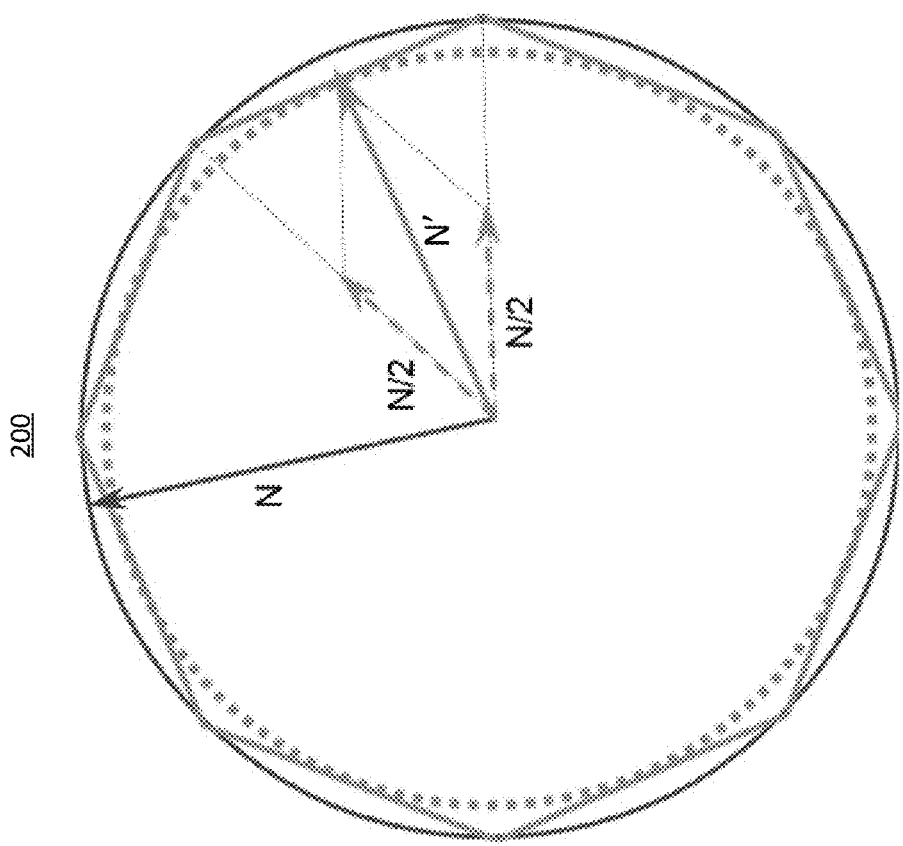
FIG. 2 is an example diagram 200 of an 8-phase system superimposed over a polar system, in accordance with an aspect of the disclosure.

In an aspect, the LO clock generation block 104.2 generates 8 clocks (i.e., phase-shifted versions of the synthesized frequency signal generated by the PLL 104.1) to strike a balance between complexity and maximal power drop. This is further demonstrated in the diagram 200 shown in FIG. 2 and the adjacent Table 250. The diagram 200 illustrates an 8-phase system superimposed over a polar system having a radius "N." As shown in FIG. 2 and the table, the difference between the radius N and N' represents a maximum power loss of approximately 0.67 dB for 8 phases, which is decreased from 3 dB for a conventional IQ transmitter implementing only 4 phases. The Table 250 further shows the maximum and average power loss for additional multiple phases implementations such as 16 and 32-phases.

Figure 3:
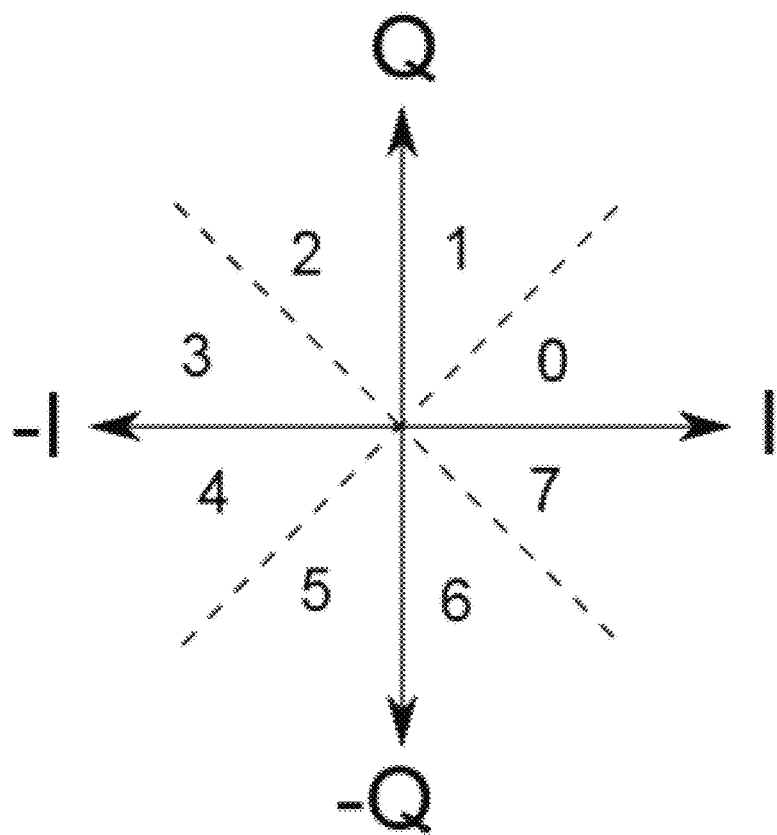
FIG. 3 is an example diagram 300 of a data constellation for an 8-phase system, with a segment for each of the 8 phases, in accordance with an aspect of the disclosure.

As used herein, a data-dependent delay means that the delay of the original IQ data (e.g., the $I_{BB}$ and $Q_{BB}$ data shown in FIG. 1) is dependent on a particular sector or segment in which a particular IQ complex value occupies within the constellation map. This use of "segments" or "sectors," which may be denoted by 'm' or 'NI,' are used interchangeably herein, as shown in FIG. 3. For example, as shown in diagram 300 of FIG. 3, for an 8-phase system, the total number of sectors or segments is 8, with each sector 0 through 7 occupying a portion of the constellation map associated with one-eighth of the total phase angle, or 45 degrees in this case. In other words, the data delay adjustment is sector dependent.

Because a multi-phase system is implemented by the transmitter architecture 100 as discussed herein, the I/Q data needs to be "re-mapped" to a new axis in accordance with the number of phases used. For example, if 8 different phases are implemented as shown in FIG. 3, the phase angle between each segment m is 45 degrees, as shown by the 45-degree axis depicted in FIG. 4A. Thus, the symbol 402, which is ordinarily mapped within the constellation in terms of the 90 degree in-phase (I) and quadrature (Q) phase axes as (I,Q), can be re-mapped in terms of the new 45-degree axis, in this example, in accordance with an 8-phase system. For example, as shown in diagram 400, a symbol 402 is mapped to a new 45-degree axis represented as a function of summed vector components n1 and n2. As shown in FIG. 4A, these vector component magnitudes are calculated based upon the phase angle between adjacent segments, which is dependent upon the total number of phases used.

For instance, in the example shown in FIG. 4A (i.e., for data in segment 0), the vector component n1 is equivalent to the difference between the I and Q component values (I−Q), whereas the vector component n2 is equivalent to the projection of the magnitude of Q along the 45-degree axis, or $Q\sqrt{2}$. Of course, the particular segment in which the symbol resides may alter these calculations, and thus the segment m in which the symbol 402 resides is also taken into account to ensure the right sign is calculated when the symbol 402 is re-mapped, as further discussed below. Again, the calculations and examples used herein are mainly directed to an 8-phase system, although aspects are not limited in this regard. For instance, the mathematical calculations shown with regards to FIG. 4A may be adapted to any number of segments based upon the number of phases used.

Moreover, the aspects described herein advantageously leverage the use of what is referred to herein as the "mirroring" principle. For example, as shown in FIG. 4B, the second segment II is mirrored to first segment I. For an 8 phase system, the radially extending boundary that delimits these two segments is the 45-degree "mirror axis" as shown in FIG. 4B, which corresponds to the 45-degree axis shown in FIG. 4A in this 8-phase example. Using mirrored sectors in this way, a continuous signal may be implemented during a sector change. For example, every second sector (i.e. all odd or all even sectors) may be mirrored. In other words, the components n1 and n2 as shown in FIG. 4A may mathematically occupy any one of the sectors of I-VIII as shown in FIG. 4B to represent a particular symbol. However, by leveraging the mirroring principle, the component n1 can be one of vectors I, III, V or VII, as shown in FIG. 4B, whereas the component n2 can be one of vectors II, IV, VI, or VIII, depending on the particular segment m in which the data symbol currently resides within the constellation.

By taking advantage of this system, a separation of the clock signals used for the components n1 and n2 may be realized. This may allow for less frequent clock switching as well as a simplified calculation of the components n1 and n2. For instance, as shown in FIG. 4C, the horizontal axis represents a normalized angle that varies from 0° to 360° ("1"). The vertical axis represents a magnitude of the components n1 and n2. In the example presented in FIG. 4C, the summed vector components n1 and n2 form IQ data points of a constant magnitude, i.e., only the phase angle is changing from 0 to 1 (full rotation). Thus, FIG. 4C illustrates that the delay of the original IQ data is dependent on the sector m that contains the IQ complex value.

To facilitate such data delay adjustments and to ensure that the appropriate LO clocks are selected and provided to the RFDAC 106, aspects include the MP DFE 102 implementing an asynchronous sample rate converter (ASRC) 102.1, a segment calculation block 102.2, and an IQ to MP calculation block 102.3. In various aspects, the ASRC 102.1, segment calculation block 102.2, and IQ to MP calculation block 102.3 may be implemented in accordance with any suitable hardware and/or software components. For instance, one or more of the ASRC 102.1, segment calculation block 102.2, and IQ to MP calculation block 102.3 may be implemented as portions of a digital signal processor or other suitable computer processor that is implemented as part of the transmitter in which the transmitter architecture 100 is a part.

In an aspect, the ASRC 102.1 may be implemented in accordance with known ASRC architectures but with an additional data delay. In particular, aspects include the ASRC 102.1 introducing an additional data delay to ensure that the data is aligned with the particular clock signals generated by the LO clock generation block 104.2, which is based upon the segment m occupied by the I/Q data at a particular time instant, as further discussed below. The delay may be calculated and implemented using any suitable number of techniques, with two examples, which are further discussed below, applying a data delay in accordance with the baseband rate and another applying a data delay in accordance with the RF rate.

In an aspect, the ASRC 102.1 samples the baseband I and Q data on an equidistant time grid, and the sampled data is used at a particular time instant by the segment calculation block 102.2 to calculate a current segment of the constellation in which the delayed data is occupied. This is further discussed below, and may include the use of any suitable hardware and/or software to facilitate this calculation. Furthermore, the segment m may be represented as any suitable number of digital bits to adequately represent the segment number, which is also discussed below. For example, for an 8 phase system, 3 bits (e.g., $m_2 m_1 m_0$) may be used to represent each of the eight segments I-VIII occupied by the delayed sampled IQ data output by the ASRC 102.1, as discussed above with reference to FIGS. 4A-4C.

Moreover, aspects include the IQ to MP calculation block 102.3 calculating the n1 and n2 component values on the RF rate, which results in new values on the same equidistant time grid. Since clock signals switch between different phases (shifted clock signals) for different segments m and different components n1 and n2, aspects include the IQ to MP calculation block 102.3 calculating data values at different points in time depending on the clock signal used at a particular time instant for particular components n1 and n2.

To provide an illustrative example, FIG. 5 shows each of the LO clocks used in accordance with an 8-phase system. The data-delayed samples may follow an entirely different IQ RF trajectory than that shown in FIG. 5 depending upon the particular data that is encoded for transmission at a particular time. However, the IQ trajectory rate diagram shown in FIG. 5 is provided for ease of explanation and to fully demonstrate how the system is facilitated, as a delayed IQ data point occupies each one of the 8 segments m over successive time instants. The sample IQ data and RF trajectory rate shown in FIG. 5 thus demonstrates how a symbol within any of the 8 segments at any particular time instant may be data aligned with a pair of LO clocks within the transmitter architecture 100.

Continuing this example with reference to FIG. 5, $T_C$ is defined as the period of a clock signal on a particular carrier frequency $f_c$. For an 8-phase system, the LO clock generation block 104.2 provides 4 clocks signals LO I-IV, which are mutually shifted from one another by $T_C/8$ (i.e., a phase shift of 45°). Aspects include the LO clock generation block 104.2 also generating inverted versions of the LO clock signals V-VIII, for a total of 8 clock signals. Accordingly, the data values are adjusted for the clock signal used at the particular time instant that is dependent on the segment m.

As further discussed below, the IQ to MP calculation block 102.3 provides data to the RFDAC 106 such that the data generated by the ASRC 102.1 is time-aligned with the appropriate LO clock generated by the LO clock generation block 104.2. As shown in FIG. 5, the mirroring principle allows one of the "odd" LO clocks I, III, V, and VII (depicted in blue) to be used for the n1 component, whereas one of the "even" LO clocks II, IV, VI, and VIII (depicted in red) is used for the n2 component. In this way, two of the LO clocks generated by the LO clock generation block 104.2 may be used for each respective component n1, n2, of the re-mapped delayed data. For example, at each of the 8 different time instants as shown in FIG. 5, the blue data point is associated with the n1 component, and the red data point is associated with the n2 component. Because of the delay introduced into the sampled data, it is ensured that at any point in time the RFDAC 106 receives the data components n1 and n2 aligned in time with appropriate combination of LO clocks I-VIII.

In an aspect, either the original up-sampled data values or values delayed by $T_C/8$, $T_C/4$ or $3T_C/8$, should be used for data transmission via the RFDAC 106. To avoid the need of a sampling frequency of $8 \cdot f_C$, aspects include the transmission architecture 100 performing a data-dependent interpolation to delay the original (baseband IQ) data. As further discussed in more detail below, aspects include different possibilities for realizing the data-dependent delay adjustment.

In various aspects, the data delay may be calculated and applied at either the baseband rate in the interpolation stage (e.g., as further discussed below with reference to FIG. 9) or calculated and applied at the RF rate (e.g., as further discussed below with reference to FIG. 10). For example, in aspects in which the data delay is calculated and applied at the baseband rate via the interpolation stage, higher order interpolation may be performed to avoid data processing at the RF rate. However, regardless of how the data delay is calculated and applied (i.e., either at the baseband rate or the RF rate), aspects include the logic described herein with reference to FIGS. 6-8 to calculate the segment m and the components n1 and n2 being calculated at the RF rate. In other words, the data delay calculations themselves may performed and applied at either the interpolation stage or the RF rate, although the segment m and components n1 and n2 are still calculated on the RF rate, in any case, in the same manner.

FIG. 6 illustrates an example schematic diagram implementation to calculate the segment m to facilitate data dependent delay. In an aspect, the segment calculation block 600 may include components and logic identified with the segment calculation block 102.2, as shown in FIG. 1. In the example shown in FIG. 6, the I and the Q (upsampled) baseband data are each associated with a 15 bit digital word, although the aspects described herein are not limited to this example and may be adapted to systems with I and Q data represented as any suitable number of bits. In other words, the input data I and Q shown in each of FIGS. 6-8 as further discussed herein are with regards to upsampled baseband data, i.e., the I and Q baseband data after being upsampled to the RF rate using the components in accordance with a particular DFE aspect, such as those discussed herein with reference to FIGS. 9 and 10, for example. Thus, as discussed above, aspects include the calculations described with reference to FIGS. 6-8 being performed on the RF rate.

The segment calculation block 102.2 uses the digital words representing the I and the Q data at a particular time instant to provide the segment data as digital data. In this example, 8 phases are used, and thus the current segment may be represented as a number of bits to yield a binary-coded segment in the form $m_2m_1m_0$, with 000 being the lowest segment number (e.g., segment 0 as shown in FIG. 3), and 111 being the highest segment number (e.g., segment 7 as shown in FIG. 3). Again, for other aspects in which the number of phases is less than or greater than 8, the segment calculation block 102.2 may be adapted to provide the segment number encoded with the appropriate number of bits.

As shown in FIG. 6, the absolute value block decision 602 may be implemented with any suitable type of logic, hardware, and/or software to provide a logical output based upon the condition shown. In other words, when the condition $|I|<|Q|$ is satisfied (i.e., true), then the data line output by the absolute value decision block 602 may be a logical true. Otherwise, the data line output by the absolute value decision block 602 may be a logical false. The absolute value decision block 602 may utilize known solutions to provide this determination.

Furthermore, the exclusive OR gate 606 may compare the most significant bit from each of the I and Q data words, with the output of the XOR gate 606 forming bit $m_1$, which is also input to another XOR gate 604. The output of the XOR gate 604, which also receives the output of the absolute value decision block 602, provides bit $m_0$ as an output. Finally, the most significant bit of the Q data word is output as bit $m_2$.

With this implementation, the segment number $m_2m_1m_0$ may be calculated based upon the baseband I and Q data words at any particular time instant. A truth table associated with the logical implementation of the segment calculation block 102.2 is shown below as Table 1.

TABLE 1

| INPUTS | | | OUTPUTS |
|---|---|---|---|
| $|I| < |Q|$ | $I_{14}$ | $Q_{14}$ | $m_2m_1m_0$ |
| 0 | 0 | 0 | 000 |
| 0 | 0 | 1 | 111 |
| 0 | 1 | 0 | 011 |
| 0 | 1 | 1 | 100 |
| 1 | 0 | 0 | 001 |
| 1 | 0 | 1 | 110 |
| 1 | 1 | 0 | 010 |
| 1 | 1 | 1 | 101 |

FIG. 7 illustrates an example schematic diagram implementation to calculate the component n1 to facilitate data dependent delay. In an aspect, the n1 component calculation block 700 may include components and logic identified with the IQ to MP calculation block 102.3, as shown in FIG. 1. By way of example and not limitation, the (upsampled) I and the Q baseband data shown in FIG. 7 are each associated with a 15 bit digital word, which may be modified in any suitable known manner to provide the absolute value of each of the I and Q data values as inputs. The IQ to MP calculation block 102.3 uses the digital words representing the absolute values of the I and the Q data at a particular time instant to output the n1 component as another digital word having the same number of bits as the I and Q digital baseband data (i.e., 15 bits in this example).

As shown in FIG. 7, a difference block 702 performs a subtraction of the absolute values of the I and Q digital baseband data, which is in turn fed into an absolute value block 704. Both the difference block 702 and the absolute value block 704 may be implemented with any suitable type of logic, hardware, and/or software, such as known techniques, for example. As a result, the n1 component is output at any particular time instant based upon the I and Q baseband data, which may be represented as $||Q|-|I||$.

FIG. 8 illustrates an example schematic diagram implementation to calculate the component n2 to facilitate data dependent delay. In an aspect, the n2 component calculation block 800 may include components and logic identified with the IQ to MP calculation block 102.3, as shown in FIG. 1. Similar to the calculation of n1 component described with reference to FIG. 7, the I and the Q (upsampled) baseband data shown in FIG. 8 are also each associated with a 15-bit digital word, which may be modified in any suitable known manner to provide the absolute value of each of the I and Q data values as inputs. The IQ to MP calculation block 102.3 thus uses the digital words representing the absolute values of the I and the Q data at a particular time instant to output the n2 component as another digital word having the same number of bits as the I and Q digital baseband data (i.e., 15 bits in this example).

As shown in FIG. 8, a multiplexer 802 selectively outputs either the I digital word or the Q digital word based upon the logical state of the control bit output by the segment decision block 804. In an aspect, the segment decision block 804 may be implemented with any suitable type of logic, hardware, and/or software to provide a logical output based upon the condition shown. In other words, when the segment bit $m_1$ is equal to the segment bit $m_0$, which occurs when the I and Q data reside in segments 0, 3, 4, or 7 (e.g., as shown in FIG. 3), then the condition is satisfied (i.e., true), and the data line output by the absolute value decision block 602 is a logical true. Otherwise, when the I and Q data reside in segments 1, 2, 5, or 6, then data line output by the segment decision module 804 is a logical false.

In other words, the IQ to MP calculation block 102.3 may leverage mirroring to simplify the calculation of n2. The IQ to MP calculation block 102.3 may also include a multiplier block 806 configured to perform a digital scaling of either the I digital data or the Q digital data output by the multiplexer 802. In the example shown in FIG. 8, a constant scaling value of $\sqrt{2}$ is chosen based upon the number of phases being 8, as discussed with reference to FIG. 4A.

Each of the multiplexer 802, the segment decision module 804, and the multiplier block 806 may be implemented with any suitable type of logic, hardware, and/or software, such as known techniques, for example. As a result, the component n2 may represent a projection of either the I or the Q data to the 45-degree axis that delimits each of the 8 segments, depending upon the particular segment by applying an appropriate scaling value. With this implementation, the component n2 may be calculated based upon the baseband I and Q data words at any particular time instant. A truth table associated with the logical implementation of the segment calculation block 102.2 for the n2 component calculation block 800 is shown below in Table 2.

TABLE 2

| INPUTS $m_2m_1m_0$ | OUTPUTS n2 Component |
|---|---|
| 000 | $\|Q\| \cdot A$ |
| 001 | $\|I\| \cdot A$ |
| 010 | $\|I\| \cdot A$ |
| 011 | $\|Q\| \cdot A$ |
| 100 | $\|Q\| \cdot A$ |
| 101 | $\|I\| \cdot A$ |
| 110 | $\|I\| \cdot A$ |
| 111 | $\|Q\| \cdot A$ |

In other words, aspects include the n2 component calculation block 800 leveraging the mirroring principle such that the calculated n2 component is equal to Q multiplied by the constant A when $|I|>|Q|$, and equal to I multiplied by the constant A when $|Q|>|I|$.

FIG. 9 illustrates a detailed DFE implementing data-dependent delay adjustments at a baseband rate. As further discussed below, using this approach, only MUX operations, summation, absolute value calculations, and one multiplication by a constant are performed at the RF-rate, whereas data-delay is performed at the baseband rate. In an aspect, the DFE 900 shown in FIG. 9 may be identified as a more detailed version of the DFE 102 as shown in FIG. 1.

In an aspect, to accomplish data delay at the baseband rate versus the RF rate, the DFE 900 shown in FIG. 9 utilizes a synchronous sample rate converter (SRC) 902 in conjunction with a data delay and upsampling block 904. Thus, for the example aspect shown in FIG. 9, the SRC 902 and the data delay and upsampling block 904 in combination may be identified with the ASRC 102.1 as shown in FIG. 1. To facilitate data delay at the baseband rate, the data delay and upsampling block 904 may be implemented with any suitable number and type of components to assume the operations regarding upsampling and interpolating data from the baseband rate to an RF rate. The SRC and data delay and upsampling block 904 are shown as separate components in FIG. 9 for ease of explanation, although aspects include the SRC 902 and the data delay and upsampling block 904 being combined as part of a single block, component, processing circuitry, etc.

The DFE 900 may further include a segment calculation block 906, an n1 component calculation block 908, an n2 component calculation block 910, and multiplexers I MUX 912, Q MUX 914, I MUX 916, and Q MUX 918, with each multiplexer receiving the original up-sampled data values and each of the delayed values (¼) $T_C$, (⅛) $T_C$, and (⅜) $T_C$, as further discussed below. Thus, the segment calculation block 906 may be identified with the segment calculation block 102.2, and each of the multiplexers, n1 component calculation block 908, and n2 component calculation block 910 may be identified with the IQ to MP calculation block 102.3, as shown in FIG. 1.

Therefore, each of the components of the DFE 900 may include any suitable combination of hardware and/or software to carry out their respective functions as described herein. For example, the adder block 905, the data delay and upsampling block 904, the segment calculation block 906, each of the multiplexers, the n1 component calculation block 908, and/or the n2 component calculation block 910 may be implemented as circuitry, discrete hardware components, and/or as portions of a suitable computer processors (e.g., a digital signal processor) to facilitate the various functions as described herein.

For example, the DFE 900 as shown in FIG. 9 includes an adder block 905, which may be implemented, for example, as any suitable number and type of components configured to add a constant value to a 2-bit digital word. For instance, the adder block 905 as shown in FIG. 9 may be implemented as a simple 2-bit adder or an adder having any other suitable number of bits based upon the particular DFE implementation in accordance with the number of phases used. As shown for the example 8-phase DFE 900 in FIG. 9, the adder block 905 may facilitate an adding operation of adding a constant value of '1' to a 2-bit digital value represented by two bits $m_1m_0$ associated with the segment data $m_2m_1m_0$. The output of the adder block 905 is, for the example 8-phase system discussed herein, also a 2-bit digital word.

As shown in FIG. 9, the data delay and upsampling block 904 receives synchronously-sampled baseband data from the digital SRC 902. This sampling may be performed at any suitable rate depending on the frequency of operation (e.g., the carrier frequency used for data transmission). As shown in FIG. 9, the data delay and upsampling block 904 first introduces an appropriate delay into the I/Q baseband data received from the SRC 902, which is then upsampled at an upsampling rate $f_s$. As shown in FIG. 9, the upsampling rate $f_s$ is equal to the carrier frequency $f_c$, although aspects are not limited in this regard and any suitable upsampling rate may be implemented by the data delay and upsampling block 904. However, because the example shown in FIG. 9 assumes that 8 phases are implemented, a traditional DFE would need to upsample the digital samples received by the SRC 902 at a frequency that is proportional to the number of phases used, or a rate $f_s=8f_c$. Moreover, if neither this higher sampling rate nor a data delay is implemented, the resulting data would be misaligned with the LO clock signals, resulting in an increased unwanted in-band and out of band spectral emission, causing decreased system performance.

The aspects described herein thus advantageously avoid the need to upsample the data at this rate, which would require the generation of LO clocks at a much higher frequency. For carrier frequencies within the GHz range (e.g., mm-wave data transmissions), this may be particularly challenging and power intensive. Thus, to facilitate upsampling at a lower rate, aspects include the data delay and upsampling block 904 performing a proper data-dependent interpolation to delay the original data. To perform the appropriate delay, sets of data samples (e.g., as digital words forming bitstreams over time) are generated by the data delay and upsampling block 904 having different delays with respect to the period $T_C$ of the carrier frequency $f_c$ of the transmitted signal. Sets of these delayed data samples are then selected depending upon the current constellation segment m in which the data currently resides when received by the data delay and upsampling block 904 via the SRC 902.

In other words, sets of delayed data are selected depending on the current segment m, which may be calculated in different ways. In one aspect, the current segment m may be calculated by the segment calculation block 906 on the original (undelayed) IQ data, which has been upsampled to the carrier frequency $f_c$ of the transmitted signal by the data delay and upsampling block 904. In another aspect, the segment calculation block 906 may calculate the current segment m based upon some of the delayed, upsampled IQ data. In still other aspects, the segment calculation block 906 may calculate the current segment m in different ways depending upon specific pairs of IQ data, i.e., selectively using either delayed or undelayed IQ data within the same DFE implementation.

Thus, the DFE 900 implements the segment calculation block 906, which outputs a 3-bit value of the segment encoded as bits $m_2m_1m_0$, which corresponds to the constellation segment in which the IQ data (i.e., delayed or undelayed) currently resides, as discussed herein. The segment calculation block may be implemented, for example, in a similar or identical manner as the segment calculation block 600, as shown and discussed herein with reference to FIG. 6.

In an aspect, each of the multiplexers I MUX 912, Q MUX 914, I MUX 916, and Q MUX 918 utilizes the segment data output by the segment calculation block 906 to output I and Q digital data samples delayed by an amount that is a function of the current data segment in which the I and Q data reside. To do so, each multiplexer shown in FIG. 9 receives digital I and Q samples generated by the data delay and upsampling block 904 delayed by a different amount.

For example, the I MUX 912 receives one set of original, undelayed I data samples (0 input), and another set of I data samples delayed by $T_C/4$ (1 input). The I MUX 916 receives one set of I data samples delayed by $T_C/8$ (0 input), and another set of I data samples delayed by $3T_C/8$ (1 input). Similarly, the Q MUX 914 receives one set of original, undelayed Q data samples (0 input) and another set of Q data samples delayed by $T_C/4$ (1 input), and the Q MUX 918 receives one set of Q data samples delayed by $T_C/8$ (0 input), and another set of Q data samples delayed by $3T_C/8$ (1 input).

In an aspect, the control line for each of the multiplexers I MUX 912 and Q MUX 914 is coupled to the bit line $m_1'$ output by the adder block 905, which adds a constant value to the data output by the segment calculation block 906 as discussed above. Moreover, the control line for the multiplexers I MUX 916, and Q MUX 918 is coupled to the bit line $m_1$ from the output of the segment calculation block 906 ($m_2m_1m_0$). This logic allows the control line to facilitate each multiplexer selectively coupling one of the two versions of I data or Q data received at each multiplexers' respective inputs to the n1 and n2 component calculation blocks 908, 910. For example, with reference to FIG. 3 and Table 1, the bit line $m_1$ is a logical false value (e.g., 0) when the current I/Q data resides in one of segments 0, 1, 4, or 5, and is a logical true value (i.e., 1) when the current I/Q data resides in one of segments 2, 3, 6, or 7. Similarly, $m_1'$ is a logical false value (e.g., 0) when the current I/Q data resides in one of segments 0, 3, 4, or 7, and is a logical true value (i.e., 1) when the current I/Q data resides in one of segments 1, 2, 5, or 6 ($m_1'=m_1+1$ (mod 8), where mod is number of phases used or number of segments). Continuing this example, the data output by each multiplexer shown in FIG. 9 may be summarized by Table 3 as shown below, taking into account the logic provided by the adder block 905.

TABLE 3

| Segment | $m_1$ | $m_1'$ | I MUX 912 $I_{n1}$ | Q MUX 914 $Q_{n1}$ | I MUX 916 $I_{n2}$ | Q MUX 918 $Q_{n2}$ |
|---|---|---|---|---|---|---|
| 0 | 0 | 0 | $I_{RF}$ | $Q_{RF}$ | Delayed $\frac{T_c}{8}$ | Delayed $\frac{T_c}{8}$ |
| 1 | 0 | 1 | Delayed $\frac{T_c}{4}$ | Delayed $\frac{T_c}{4}$ | Delayed $\frac{T_c}{8}$ | Delayed $\frac{T_c}{8}$ |
| 2 | 1 | 1 | Delayed $\frac{T_c}{4}$ | Delayed $\frac{T_c}{4}$ | Delayed $\frac{3T_c}{8}$ | Delayed $\frac{3T_c}{8}$ |
| 3 | 1 | 0 | $I_{RF}$ | $Q_{RF}$ | Delayed $\frac{3T_c}{8}$ | Delayed $\frac{3T_c}{8}$ |
| 4 | 0 | 0 | $I_{RF}$ | $Q_{RF}$ | Delayed $\frac{T_c}{8}$ | Delayed $\frac{T_c}{8}$ |

TABLE 3-continued

| Segment | $m_1$ | $m_1'$ | I MUX 912 $I_{n1}$ | Q MUX 914 $Q_{n1}$ | I MUX 916 $I_{n2}$ | Q MUX 918 $Q_{n2}$ |
|---|---|---|---|---|---|---|
| 5 | 0 | 1 | Delayed $\frac{T_c}{4}$ | Delayed $\frac{T_c}{4}$ | Delayed $\frac{T_c}{8}$ | Delayed $\frac{T_c}{8}$ |
| 6 | 1 | 1 | Delayed $\frac{T_c}{4}$ | Delayed $\frac{T_c}{4}$ | Delayed $\frac{3T_c}{8}$ | Delayed $\frac{3T_c}{8}$ |
| 7 | 1 | 0 | $I_{RF}$ | $Q_{RF}$ | Delayed $\frac{3T_c}{8}$ | Delayed $\frac{3T_c}{8}$ |

In an aspect, the n1 and n2 component calculation blocks 908, 910 may be implemented as the n1 and n2 component calculation blocks 700, 800, respectively, as shown and discussed herein with reference to FIGS. 7 and 8. Although not shown for purposes of brevity, each of the n1 and n2 component calculation blocks 908, 910 may include additional known components to convert the received I and Q data samples output from each respective multiplexer shown in FIG. 9 to absolute values to facilitate the calculation of the n1 and n2 components. In particular, aspects include the n1 component calculation block 908 receiving the digital m segment data from the segment calculation block 906 and the data output by the I MUX 912 and Q MUX 914.

Based upon the logic as shown in the Table 3 above, the n1 component calculation block 908 receives the $I_{n1}$ data from the I MUX 912, which is undelayed when the I/Q data is contained within segments 0, 3, 4, or 7, and is delayed by $T_c/4$ when the I/Q data is contained within segments 1, 2, 5, or 6. Moreover, the n1 component calculation block 908 receives the $Q_{n1}$ data from the Q MUX 914, which is undelayed when the I/Q data is contained within segments 0, 3, 4, or 7, and is delayed by $T_c/4$ when the I/Q data is contained within segments 1, 2, 5, or 6.

Likewise, the n2 calculation block 910 receives the $I_{n2}$ data from the I MUX 916, which is delayed by $T_c/8$ when the I/Q data is contained within segments 0, 1, 4, or 5, and is delayed by $3T_c/8$ when the I/Q data is contained within segments 2, 3, 6, or 7. Finally, the n2 component calculation block 910 receives the $Q_{n2}$ data from the Q MUX 918, which is delayed by $T_c/8$ when the I/Q data is contained within segments 0, 1, 4, or 5, and is delayed by $3T_c/8$ when the I/Q data is contained within segments 2, 3, 6, or 7.

In this way, the DFE 900 functions to calculate the n1 and n2 components to adapt to the delay introduced by the data delay and upsampling block 904, as shown in FIG. 5. In an aspect, the n1 and n2 components are inputs to the RF-DAC (e.g., RF-DAC 106) and, are thus properly time-aligned with the appropriate LO clocks upon which the data delay was based.

In alternate aspects, which are discussed further below with reference to FIGS. 10-11, the data delay is provided at the RF rate instead of the baseband rate delay introduced via the DFE 900 shown in FIG. 9. FIG. 10 illustrates an example DFE 1000 which, in contrast to the DFE 900, facilitates the data delay at the RF rate. To do so, the DFE 1000 includes a digital SRC 1002, similar to the SRC 902 of the DFE 900 shown in FIG. 9. However, the DFE 1000 implements an ASRC 1004, which initially upsamples the I/Q baseband data received from the SRC 1002 at an upsampling rate $f_s$ to provide the I/Q data at the RF rate. This upsampling may be performed at any suitable rate depending on the frequency of operation (e.g., the carrier frequency used for data transmission). As shown in FIG. 10, the upsampling rate $f_s$ is equal to the carrier frequency $f_c$, although aspects are not limited in this regard and any suitable upsampling rate may be implemented by the ASRC 1004. Thus, aspects include the SRC 1002 and the ASRC 1004, in combination with the I data delay block 1005 and the Q data delay block 1007, which are described in further detail below, being identified with the ASRC 102.1 as shown in FIG. 1.

Also similar to the DFE 900, the DFE 1000 includes multiplexers associated with the I and Q data, which function to selectively couple specific data-delayed versions of the upsampled I/Q data (or without a delay) to n1 and n2 component calculation blocks 1008, 1010 as a function of the segment calculated via the segment calculation block 1006. The multiplexers associated with the I and Q data, the n1 and n2 component calculation blocks 1008, 1010, and the segment calculation block 1006 may operate identical to or in a substantially similar manner as these same respective components described with reference to the DFE 900 as shown in FIG. 9. Furthermore, and as further discussed below, the digital SRC 1002, the ASRC 1004, multiplexers, the n1 and n2 component calculation blocks 1008, 1010, the segment calculation block 1006, and/or the I and Q data delay blocks 1005, 1007 may be implemented as circuitry, discrete hardware components, and/or as portions of a suitable computer processors (e.g., a digital signal processor) to facilitate the various functions as described herein.

In an aspect, to introduce the data delay at the RF rate, the DFE 1000 implements separate I and Q data delay blocks 1005, 1007, as further discussed below. Each of the I and Q data delay blocks 1005, 1007 may be implemented via any suitable type of hardware, software, logic, etc., or combination thereof. An example of the I data delay block 1005 is shown in further detail in FIG. 11 as I data delay block 1100. In an aspect, the Q data delay block 1007 may include similar or identical components as the I data delay block 1100, and operate in a similar or identical manner. Therefore, only differences between these components will be further described herein for purposes of brevity.

In accordance with DFE aspects in which the delay is introduced after the I/Q baseband data is upsampled, the DFE 1000 may facilitate this data delay within each of the I and Q data delay blocks 1005, 1007 in two different ways. In a first aspect, recalculations are executed to convert or re-map the I/Q data to the n1 and n2 components, and then the data-delay is performed. In a second aspect, this order is reversed, with the data delay first being performed on the original (i.e., upsampled) data, and then the recalculations being executed to convert or re-map the (now delayed) I/Q data to the n1 and n2 components.

Because the recalculated components n1 and n2, separately, have a wider bandwidth than the original I and Q data, it may be particularly useful to perform the data-delay via interpolation on the original data first, and then perform the recalculations of the n1 and n2 components. In this case, 1st order interpolation may be sufficient to avoid undesirable performance degradation. However, regardless of the order in which the data delay and recalculations are performed, the delays needed are fractions of one RF cycle (i.e., 1/8, 2/8, and 3/8). Therefore, aspects include the I and Q data delay blocks 1005, 1007 introducing these delays using a bit-shift operation (implemented via bit-shift blocks 1102, 1104A, and/or 1104B), a summation operation, and a register for storing previous values (implemented via register 1106A and/or register 1106B).

In an aspect, either register 1106B or the bit shift block 1104B may be implemented as part of the I data delay block 1100 in accordance with the two different aspects mentioned above (i.e., applying the data delay before or after the n1 and n2 component calculations). Regardless of whether register 1106B or the bit shift block 1104B is implemented, the result is the same in each case. The I data delay block 1100 illustrated in FIG. 11 shows 2 different possibilities of implementation by way of example and not limitation, and aspects include more or less shift registers and/or more memory units used to facilitate the desired data delay. Moreover, aspects include the I data delay block 1100 being further optimized and/or modified to produce the same results. For example, the I data delay block 1100 may produce the same results using less adders.

In any event, using the architecture of the I data delay block 1100 shown in FIG. 11, aspects include each of the I and Q data delay blocks 1005, 1007 generating an undelayed version of the upsampled I/q data as $I_0$, $Q_0$, as well as delayed versions of the upsampled I/Q data as $I_{1/4}$, $Q_{1/4}$; $I_{1/8}$, $Q_{1/8}$; and $I_{3/8}$, $Q_{318}$. In this case, however, these delayed (or undelayed) versions of the upsampled I/Q data may be with regards to the period of the RF rate used for signal transmission. Again, although only 3 versions of the delayed upsampled I/Q data are shown in FIG. 11 in addition to the undelayed I/Q data, any suitable number of signals may be generated by each of the I and Q data delay blocks 1005, 1007 based upon the number of phases used for a particular DFE MP implementation.

Similar to the DFE 900 as shown and discussed above with reference to FIG. 9, the DFE 1000 as shown in FIG. 10 also includes an adder block 1003, which may be implemented and function in the same manner as adder block 905, as discussed above with reference to DFE 900. Moreover, the DFE 1000 may include I and Q multiplexers 1012 and 1014 having a control line that is coupled to the output $m'_1$ of the adder block 1003, whereas the I and Q multiplexers 1016 and 1018 have a control line that is coupled to the $m_1$ output from segment calculation block 1006. This logic thus causes the I and Q multiplexers 1012, 1014, 1016, and 1018 to selectively couple delayed versions of the upsampled I/Q data generated by the I data delay and Q data delay blocks 1005, 1007 based upon the current constellation segment in which the upsampled data currently resides. To provide an illustrative example, the data output by each multiplexer shown in FIG. 10 may be summarized by Table 4 as shown below.

TABLE 4

| Segment | $m_1$ | $m_1'$ | I MUX 1012 $I_{n1}$ | Q MUX 1014 $Q_{n1}$ | I MUX 1016 $I_{n2}$ | Q MUX 1018 $Q_{n2}$ |
|---|---|---|---|---|---|---|
| 0 | 0 | 0 | $I_0$ | $Q_0$ | Delayed $I_{1/8}$ | Delayed $Q_{1/8}$ |

TABLE 4-continued

| Segment | $m_1$ | $m_1'$ | I MUX 1012 $I_{n1}$ | Q MUX 1014 $Q_{n1}$ | I MUX 1016 $I_{n2}$ | Q MUX 1018 $Q_{n2}$ |
|---|---|---|---|---|---|---|
| 1 | 0 | 1 | Delayed $I_{1/4}$ | Delayed $Q_{1/4}$ | Delayed $I_{1/8}$ | Delayed $Q_{1/8}$ |
| 2 | 1 | 1 | Delayed $I_{1/4}$ | Delayed $Q_{1/4}$ | Delayed $I_{3/8}$ | Delayed $Q_{3/8}$ |
| 3 | 1 | 0 | $I_0$ | $Q_0$ | Delayed $I_{3/8}$ | Delayed $Q_{3/8}$ |
| 4 | 0 | 0 | $I_0$ | $Q_0$ | Delayed $I_{1/8}$ | Delayed $Q_{1/8}$ |
| 5 | 0 | 1 | Delayed $I_{1/4}$ | Delayed $Q_{1/4}$ | Delayed $I_{1/8}$ | Delayed $Q_{1/8}$ |
| 6 | 1 | 1 | Delayed $I_{1/4}$ | Delayed $Q_{1/4}$ | Delayed $I_{3/8}$ | Delayed $Q_{3/8}$ |
| 7 | 1 | 0 | $I_0$ | $Q_0$ | Delayed $I_{3/8}$ | Delayed $Q_{3/8}$ |

FIG. 12 illustrates a block diagram of a device in accordance with an aspect of the disclosure. In various aspects, device 1200 may be implemented as any suitable type of device configured to transmit and/or receive wireless signals in accordance with any suitable number and/or type of communication protocols. For instance, the device 1200 may be implemented as a user equipment (UE) such as a mobile phone, tablet, laptop computer, etc. To provide additional examples, the device 1200 may be implemented as an access point or base station. The device 1200 may implement one or more aspects as described herein to facilitate transmitting wireless signals in accordance with a particular frequency or band of frequencies, such as cellular communications including LTE, LTE-CA, 5G NR, etc., as further described below.

In an aspect, the device 1200 may include processing circuitry 1202, a memory 1204, and any suitable number K of transmit chains 1212.1-1212.K, each being coupled to one or more respective antennas 1214.1-2014.N. The components shown in FIG. 12 are provided for ease of explanation, and aspects include device 1200 including additional, less, or alternative components as those shown in FIG. 12. For example, device 1200 may include one or more power sources, display interfaces, peripheral devices, ports, etc. To provide additional examples, the device 1200 may further include one or more receivers, or the transmit chains 1212.1-1212.K may alternatively be implemented as transceivers capable of receiving and transmitting wireless signals via antennas 1214.1-1214.K.

In an aspect, the various components of device 1200 may be identified with functionality further described herein with reference to the generation of data-dependent delayed signals for use in a multi-phase system. For example, the wireless device 1200 may be configured to generate data-delayed signals via one or more of transmit chains 1212.1-1212.K, which are wirelessly transmitted via coupled antennas 1214.1-1214.K at any suitable frequency or band of frequencies. Each of the transmit chains 1212.1-1212.K may be identified with a respective RF-DAC, such as the RF-DAC 106 shown in FIG. 1. For example, the RF-DAC 106 shown in FIG. 1 may be identified with one or more of the transmit chains 1212.1-1212.K, and each RF-DAC may be coupled to one or more of the antennas 1214.1-12114.K via one or more components not shown in FIG. 1 for purposes of brevity (e.g., power amplifiers, filters, etc.). Moreover, each of the transmit chains 1212.1-1212.K may be coupled, via each respective RF-DAC, to either a common DFE and LO path (e.g., DFE 100 and LO path 104, as shown in FIG. 1) or to separate DFEs and LO paths, in various aspects.

Therefore, each respective one of the transmit chains 1212.1-1212.K may be identified with the overall functionality associated with the DFEs as disclosed herein, such as DFEs 900, 1000 as shown in FIGS. 9 and 10, respectively, for example.

To do so, processing circuitry 1202 may be configured as any suitable number and/or type of computer processors, which may facilitate control of the device 1200 as discussed herein. In some aspects, processing circuitry 1202 may be identified with a baseband processor (or suitable portions thereof) implemented by the device 1200. In other aspects, the processing circuitry 1202 may be identified with one or more processors implemented by the device 1200 that are separate from the baseband processor (e.g., one or more digital signal processors). In any event, aspects include the processing circuitry 1202 being configured to carry out instructions to perform arithmetical, logical, and/or input/output (I/O) operations, and/or to control the operation of one or more components of the device 1200.

For example, the processing circuitry 1202 can include one or more microprocessors, memory registers, buffers, clocks, etc., and may include, implement, or control portions of the DFE as discussed herein. Moreover, aspects include processing circuitry 1202 communicating with and/or controlling functions associated with the memory 1204 and/or the transmit chains 1212.1-1212.K. This may include, for example, calculating data delays, segments, n1 and n2 components, controlling and/or arbitrating transmit and/or receive functions of the device 1200, performing one or more baseband processing functions (e.g., media access control (MAC), encoding/decoding, modulation/demodulation, data symbol mapping, error correction, etc.).

In an aspect, the memory 1204 stores data and/or instructions such that, when the instructions are executed by the processing circuitry 1202, the processing circuitry 1202 performs the various functions described herein. The memory 1204 can be implemented as any well-known volatile and/or non-volatile memory, including, for example, read-only memory (ROM), random access memory (RAM), flash memory, a magnetic storage media, an optical disc, erasable programmable read only memory (EPROM), programmable read only memory (PROM), etc. The memory 1204 can be non-removable, removable, or a combination of both.

For example, the memory 1204 may be implemented as a non-transitory computer readable medium storing one or more executable instructions such as, for example, logic, algorithms, code, etc. As further discussed below, the instructions, logic, code, etc., stored in the memory 1204 are represented by the various modules as shown in FIG. 12, which may enable the aspects disclosed herein to be functionally realized. Alternatively, if the aspects described herein are implemented via hardware, the modules shown in FIG. 12 associated with the memory 1204 may include instructions and/or code to facilitate control, and/or monitor the operation of such hardware components. In other words, the modules shown in FIG. 12 are provided for ease of explanation regarding the functional association between hardware and software components. Thus, aspects include the processing circuitry 1202 executing the instructions stored in these respective modules in conjunction with one or more hardware components to perform the various functions associated with the aspects as further discussed herein.

In an aspect, the executable instructions stored in data delay calculation module 1205 may facilitate, in conjunction with the processing circuitry 1202, the calculation of a data delay for sampled I/Q baseband data. Again, this data delay may be introduced at the baseband rate or the RF rate. In aspects in which the data delay is introduced at the baseband rate, instructions stored in data delay calculation module 1205 may facilitate the processing circuitry 1202 performing the interpolation and data delay functionality associated with, for example, data delay and upsampling block 904, as shown in FIG. 9. To provide another example, when the data delay is introduced at the RF rate, instructions stored in data delay calculation module 1205 may facilitate the processing circuitry 1202 performing the interpolation and data delay functionality associated with, for example, the I and Q data delay blocks 1005, 1007, as shown in FIG. 10.

In an aspect, the executable instructions stored in segment calculation module 1207 may facilitate, in conjunction with the processing circuitry 1202, the calculation of a constellation segment m in which an I/Q symbol currently resides. Again, as any suitable number of phases may be used as in accordance with the various aspects described herein, segment calculation module 1207 may facilitate the appropriate logic and/or code to identity the segment based upon the number of phases used. For example, if the number of phases used is 8, then segment calculation module 1207 may function to implement the logic shown in FIG. 6 with regards to segment calculation block 600.

In an aspect, the executable instructions stored in n1 component calculation module 1209 may facilitate, in conjunction with the processing circuitry 1202, the calculation of a first vector component n1 associated with the I/Q symbol being re-mapped in accordance with a particular number of phases used. Once again using an example of 8 phases, n1 component calculation module 1209 may function to implement the logic shown in FIG. 7 with regards to n1 component calculation block 700.

In an aspect, the executable instructions stored in n2 component calculation module 1211 may facilitate, in conjunction with the processing circuitry 1202, the calculation of a second vector component n2 associated with the I/Q symbol being re-mapped in accordance with a particular number of phases used. For example, if 8 phases are used, then n2 component calculation module 1211 may function to implement the logic shown in FIG. 8 with regards to n2 component calculation block 800.

Multi-Phase Radio Frequency Digital-to-Analog Converter (RF-DAC) with Data Delay Compensation The transmitter architectures described herein utilize DFEs with RF-DACs to transmit time-aligned delayed data. In an aspect, these RF-DACs may be implemented as capacitive DACs, as further discussed below. Again, as illustrated in Table 250 as shown in FIG. 2, digital polar converters deliver the best efficiency for DFEs, as such designs result in no power drop during I/Q data conversion. However, a coordinate rotation digital computer (CORDIC) is needed to perform I/Q-to-Polar conversion, which is relatively complex. Moreover, the polar signal has a large bandwidth compared to the I/Q signal bandwidth.

Thus, as new communication standards develop, particularly those associated with cellular communications as noted herein (e.g., LTE, LTE-CA, 5G NR, etc.), a main design difficulty for polar transmitters is the generation of modulated clocks to support these new standards. For example, the new standards utilize protocols implementing bandwidths on the order of one hundred MHz bandwidth or more. Previous attempts to address these high-bandwidth requirements involved the use of digital-to-time converters, although these designs are still unproven, and thus digital I/Q architectures are still used.

Digital I/Q transmitter implementations do not require the use of a CORDIC, have a relatively simple design, and have low computing and power consumption requirements. However, as shown in Table 250 in FIG. 2, providing a phase separation of 45 degrees reduces the output power by a maximum of 3 dB. To eliminate this power penalty, aspects include leveraging the use of multiphase RF-DACs in conjunction with the multi-phase DFEs described herein. Thus, instead of using a quadrature architecture with 4 phases)(0° 90° 180° 270°, the RF-DAC aspects (like the DFE aspects described above) may implement any suitable number of phases in accordance with those utilized by the coupled DFE (e.g., 8, 16, 32, etc.).

As discussed above for the DFE aspects and shown in FIG. 4A, the transformation of the digital data from IQ to multiphase involves a computation to re-map the IQ data based upon a subtraction of the I and Q data values (for the n1 component) and a multiplication by a constant value for the other (e.g., for the n2 component a multiplication of $\sqrt{2}$ for an 8-phase architecture). With regards to the RF-DAC aspects further described throughout this section of the disclosure, the n1 vector component may also be considered synonymous with what is referred to herein as a "U" vector component, whereas the n2 vector component may further be considered synonymous with what is referred to herein as a "V" vector component.

As eluded to in the DFE aspects described above, this IQ transformation requires a recalculation of the digital data for the time shift introduced via the coupled DFE. That is, because of the sampled architecture of a RF-DAC, the digital data needs to be recalculated for the time at which the output signal is generated. If these recalculations are not performed, a small error is generated, leading to the generation of unwanted noise.

For example, the data recalculations regarding the n1 and n2 vector components are discussed above with reference to the example DFEs 900, 1000, which are input into the RF-DAC 106 as shown in FIG. 1 to ensure time-alignment with the appropriate LO clock signal pair, as shown in FIG. 5. The aspects described within this section pertain to generating the appropriate data outputs to ensure this time-alignment while obviating the need to perform complicated recalculations. To do so, the RF-DAC aspects described herein leverage the symmetry of the RF-DAC, as further discussed below. In doing so, advantages may be realized such as lower current consumption and a smaller die area.

FIG. 13 illustrates a schematic of an RF-DAC with unit cells, in accordance with an aspect of the disclosure. The RF-DAC unit cell 1300 shown in FIG. 13 is implemented as two cell halves A and B, with each unit cell half implementing a single capacitor for two capacitors per unit cell. In contrast, FIG. 14A illustrates another implementation of an RF-DAC unit cell 1402. In this aspect, which is further discussed below, each cell half implements two capacitors for four capacitors per unit cell. This differential implementation shown in FIGS. 13 and 14A-B compensates for LO leakage associated with the LO supply (e.g., LO clock generation block 104.2, as shown in FIG. 1). As shown in FIG. 13, the RF-DAC 1300 receives a pair of LO clocks LO and LO_n, with the LO clock being coupled to each input of the cell half A and the LO_n clock being coupled to each input of the cell half B via each cell half's respective AND logic gate input terminals.

As further discussed below with reference to FIG. 17, the unit cell 1300 may be one of several hundred or several thousand unit cells that comprise an overall RF-DAC implementation. Thus, the eight enable lines shown in FIG. 13 may likewise be a portion of several hundred or several thousand RF-DAC enable lines that may be individually and dynamically be set to a certain logic state. For example, the n1 and n2 vector component digital data may be fed into a decoder system that is controlled by any suitable type of processor (e.g., processing circuitry 1202 as shown in FIG. 12, a baseband processor, a digital signal processor, etc.), as further discussed below.

Thus, the enable line input to each AND logic gate may be separately controlled to have one of two logic states, such that the logic state applied to each individual enable line may be represented as part of a digital word at any particular time instant. By controlling the logic state at the input of each AND logic gate in this way, each respective AND logic gate may output either the coupled LO signal (e.g., LO or LO_n) when the enable line is asserted and the corresponding logic gate is "activated," or a fixed DC value (e.g., VDD or VSS) when the enable line is not asserted and the corresponding logic gate is "deactivated." In the example shown in FIG. 13, each of the enable lines 0, 1, 2, 4, 5, and 6 is not asserted, and thus each logic AND gate coupled to each of these enable lines produces a fixed DC voltage at its output to each respectively-coupled capacitor.

In this way, digital data represented by the n1 and n2 components may be decoded to form digital words, which are applied to each cell from among a set of unit cells constituting an RF-DAC architecture to produce a corresponding time-varying voltage output by the RF-DAC. This time-varying voltage is coupled via an impedance matching network to a transmit antenna or a power amplifier (which is in turn coupled to a transmit antenna), thus facilitating transmission of time-aligned delayed digital data. For example, as the individual bit from each digital word is applied to each enable line, a differential voltage is created at the resonant circuit 1310. The resonant circuit 1310 is impedance matched to a transmit antenna as shown in FIG. 13 (as well as other components not shown in FIG. 13 such as power amplifiers, etc.) to produce an output current that results in the RF output signal being transmitted from the antenna. Using this setup, each RF-DAC unit cell 1300 that forms part of an overall RF-DAC design may convert a multi-bit digital value to a corresponding time-varying output current based upon the calculated and time-aligned n1 and n2 vector component data, as discussed herein.

FIG. 14A illustrates a schematic of an RF-DAC, in accordance with an aspect of the disclosure. Although both RF-DACs 1300 and 1400 may be implemented as the RF-DAC 106 and used in accordance with any of the DFE aspects discussed herein, the RF-DAC unit cell 1400 represents an improvement over the RF-DAC 1300 in that complex recalculations may be avoided by leveraging design symmetry, as further discussed below.

For example, as shown in FIG. 14A, the RF-DAC 1400 includes several unit cells such as unit cell 1402, which is shown in greater detail in FIG. 14B. Each unit cell 1402 is coupled to a separate enable line (e.g., Enable_0 and Enable_1 for the unit cell 1402), which together represent two bits of a digital control word applied to the RF-DAC 1400. Again, the RF-DAC 1400 is shown in FIG. 14A as including only 3 RF-DAC unit cells, each being controlled by two enable lines. However, aspects of the RF-DAC 1400 may include several hundred or thousand RF-DAC unit cells 1402, each having a similar architecture as shown in FIG. 14B. In contrast to the RF-DAC unit cell 1300, for the RF-DAC unit cell 1402, control lines Enable_0 and Enable_1 control the active state of each respectively coupled AND logic gate for each unit cell half A and B, thus realizing a differential voltage design that provides each of the LO signal pairs at the same unit cell halves A and B.

In other words, as shown in FIG. 14B, each logic AND gate of cell half A of the RF-DAC unit cell 1402 is controlled via a separate enable line (Enable_0 and Enable_1) such that, when asserted, couple the LO and LO_n signals to each respective capacitor. Cell half B of the RF-DAC unit cell 1402 likewise provides each of the LO and LO_n signals to the each respective capacitor in accordance with the logic state of the Enable_0 and the Enable_1 control line. However, when the Enable_0 and the Enable_1 control lines are not asserted, the voltage output by each AND gate is a fixed DC voltage VSS or VDD.

For example, when the Enable_0 and the Enable_1 control lines are not asserted, the voltage X1 is a fixed DC voltage VDD, whereas the voltage X2 is a fixed DC voltage VSS. This design advantageously allows half of the deactivated capacitors for small output power scenarios (e.g., both Enable_0 and Enable_1 are not asserted) to provide a fixed DC voltage of VSS and the other half to provide a fixed DC voltage of VDD on both differential outputs (i.e., the outputs at nodes 1404A and 1404B). As a result, ripple on the supply voltage does not generate an unwanted signal at the output of the RF-DAC 1400 (i.e., via the resonant circuit 1410 coupled to the antenna).

As shown in FIG. 14B, the logic AND gates of the unit cell half A of the RF-DAC unit cell 1402 are respectively coupled to different LO signals LO and LO_n. The other input of each of the logic AND gates are coupled, respectively, to a single control line Enable_0 or Enable_1, which may have one of two logic states at any given time. The half B of the RF-DAC unit cell 1402 similarly has two logic AND gates separately coupled to the LO and LO_n signals, whereas the other inputs of the logic AND gates are coupled to a single control line Enable_0 or Enable_1, which again may have one of two logic states at any given time. Thus, because each of halves A and B of the RF-DAC unit cell 1402 provide an output that is controlled by each respective control line Enable_0, Enable_1, aspects include the each of the control lines Enable_0, Enable_1 being driven, or pulsed, in a manner such that the voltages at the capacitors coupled to each AND gate are out of phase with one another by 180 degrees.

For example, as shown in FIG. 14C, half A of the RF-DAC unit cell 1402 is driven via a pulsed enable_0 line to cause signals associated with the nodes X1 and X2 to be phase shifted from one another by 180 degrees. Continuing this example, the signal associated with the node X1 in FIG. 14B is shown in FIG. 14C as being driven from an original value of VDD to a lower voltage of VSS for a brief time period, and then back to a voltage level of VDD once again. The signal associated with node X2 in FIG. 14B, however, is shown in FIG. 14C as being driven from an original value of VSS to a higher voltage of VDD for a brief time period, and then back to a voltage level of VSS. Aspects include any suitable time periods and/or voltage levels VDD and VSS being utilized for these signal pulses in accordance with the frequency and/or design implemented by the DFE.

In an aspect, this phase shift may be realized as an additional inverter that is provided at one of the AND gate outputs, as shown in FIG. 14B. Moreover, aspects include the AND gate output being applied to a different LO signal on each half of the RF-DAC unit cell 1402. For example, the output of the AND gate on half A associated with the LO-n signal includes an additional inverter, whereas the output of the AND gate on half B associated with the LO signal includes an additional inverter. As further discussed below, this architecture leverages the use of symmetry to allow for calculations to be performed in a less complex manner. The inverters shown in FIG. 14B are by way of example and not limitation, and aspects include the RF-DAC 1400 implementing any suitable number and type of phase-shifting elements to provide this 180 degree phase shift.

In other words, as shown in FIG. 14C, the signals associated with each of the nodes X1, X2, which are associated with separate capacitors as shown in FIG. 14B, have a time-varying voltage response at the capacitors of the half A of the RF-DAC unit cell 1402 when the cell is activated at one instant in time. That is, the enable_0 line is driven in a manner that forms two sequential pulses, although there is one logic expressed in the digital data (e.g., the digital word as discussed above and further discussed below).

Thus, aspects include operating the capacitors on half A of the RF-DAC 1402 at different times such that the enable lines provide two "strobe points" in this manner, which are phase-shifted by 180 degrees from one another in accordance with the RF-DAC architecture discussed above with reference to FIG. 14B. The use of these phase-shifted strobe points may be exploited in accordance with the mirroring principle as discussed herein as applied to the multiple-phase DFE aspects. For instance, the phase-shifted enable strobe points may result in the generation of two data vectors that are phase-shifted 180 degrees from one another with regards to a constellation point data mapping. An example of this is further discussed below with reference to FIGS. 15 and 16A-B. In other words, although the control lines (e.g., Enable_0, Enable_1) are separately controlled, the difference between their logic states may be expressed in terms of signal timing. For instance, as shown in FIG. 15 and further discussed below, aspects include activating the control lines at different times, such that one control line is activated one-half of a clock cycle in advance, and de-activated when the pulse ends.

To provide an illustrative example, FIG. 15 shows two sets of signals 1500, 1550 corresponding to the RF-DAC unit cell 1402 being enabled for different sets of data. In the first set of signals 1500, the time-shifted data provided by the DFE occupy a first quadrant of a constellation map, as noted by point 1602 in FIG. 16A. In particular, the data point 1602 occupies segment 1 with respect to the segment map shown in FIG. 3 with respect to an example 8-phase DFE system. However, because the Enable_0 line is pulsed at two different time periods, a second data point (i.e., data vector) is also generated that is equivalent to the data point 1604. As shown in FIG. 16A, data point 1604 occupies the third quadrant (or fifth segment in an 8-phase system).

Continuing this example, for the second set of signals 1550, the time-shifted data provided by the DFE occupy a third quadrant of a constellation map, as noted by point 1652 in FIG. 16B. In particular, the data point 1652 occupies segment 5 with respect to the segment map shown in FIG. 3 for an example 8-phase DFE system. Again, because the Enable_0 line is pulsed at two different time periods, a second data point (i.e., data vector) is also generated that is equivalent to the data point 1654. As shown in FIG. 16B, data point 1654 occupies the first quadrant (or first segment in an 8-phase system).

In other words, the data points 1602 and 1654, as well as the data points 1604 and 1654, may be treated as vector-exchanged pairs. That is, the difference between the signals 1500 associated with the data point 1602 in the first quadrant and the signals 1550 associated with the data point 1652 in the third quadrant may be realized simply by exchanging the vectors. Thus, aspects include the shift in time provided by the DFE regarding the delayed data being compensated by the 4-capacitor RF-DAC unit cell 1402. For instance, the mathematical average of the strobe point associated with both data point 1602 and data point 1652 as shown in FIGS. 16A-B is the same, and is symmetric over each of the 4 quadrants.

Thus, aspects include the RF-DAC 1400 leveraging the architecture and enable strobe timing as discussed herein to avoid the complicated digital recalculations that would otherwise be necessary. The calculation to determine the strobe timing based upon the data received from the DFE may be performed in accordance with any suitable techniques, such as those disclosed in U.S. patent application Ser. No. 14/858,133 filed on Sep. 18, 2015, for example, which is hereby incorporated by reference in its entirety.

FIG. 17 illustrates an example architecture of a multi-phase RF-DAC, in accordance with an aspect of the disclosure. The architecture 1700 shown in FIG. 17 includes several components discussed above with respect to the transmitter architecture 100 as shown in FIG. 1. Thus, the architecture 1700 and accompanying description is provided herein to clarify the interoperability of the improved RF-DAC 1400 discussed in the second section of this disclosure with the multiphase DFE improvements discussed in the first section.

As shown in FIG. 17, the architecture 1700 includes several components that also assume an 8-phase multiphase DFE system, although the aspects described herein are not so limited. For example, assuming that an 8 phase system is implemented, the octant select block 1702 may be identified with the segment calculation block 102.2 as shown in FIG. 1 and/or the segment calculation block 600 as shown in FIG. 6. Furthermore, calculation block 1704 may be identified with the n1 component calculation block 700, as shown in FIG. 7, and calculation block 1706 may be identified with the n2 component calculation block 800, as shown in FIG. 8.

In an aspect, the result of the octant select block 1702 is the calculation of the constellation segment occupied by the I/Q data. This calculation may be used in conjunction with any suitable type of logic to control the clock signals LO and LO_n output by the multiplexers 1708, 1710. For example, the input to each of the multiplexers 1708, 1710 may include a set of phase-shifted LO clock signal signals having a granularity matching that of the number of phases used in the DFE. For instance, assuming that the architecture 1700 is associated with an 8 phase DFE, then the LO clock signals provided to each of the multiplexers 1708, 1710 are shifted versions of one-eighth of a clock cycle, as shown in FIG. 17.

To facilitate the phase-shifting of the clock signal 1602.2, any suitable number and/or type of delay elements or clock generation circuitry may be implemented, which are not shown in FIG. 17 for purpose of brevity. For example, the LO clock signals provided to the multiplexers 1708, 1710 may be generated from a delay locked loop, a phase-locked loop, a local multi modulus divider configured to generate the phases from a clock with an n-times higher frequency, etc. In any event, aspects include the current segment occupied by the I/Q data being used to select the appropriate LO clock signals LO and LO_n at the outputs of each of the multiplexers 1708, 1710, respectively. In an aspect, the multiplexers 1708, 1710, and their associated LO clocks may be identified, for example, with the LO path 104 as shown in FIG. 1.

To provide an illustrative example, data lines output by the octant select block 1702 may carry data indicative of digital bit values as discussed herein, and logic may be provided to ensure that the appropriate LO clocks are output from the multiplexers 1708, 1710 based upon this segment data. In an aspect, the LO clock output from multiplexer 1708 may be coupled to the column decoder U block 1712, whereas the LO_n clock output from the multiplexer 1710 may be coupled to the column decoder V 1714.

Each of the column decoder U block 1712 and the column decoder V block 1714 may be identified with the IQ to MP calculation block 102.3, for example, as shown in FIG. 1. Moreover, the synchronize block 1716, line decoder U block 1718, and the line decoder V block may likewise be identified with the IQ to MP calculation block 102.3. In an aspect, the column decoder U block 1712 and the column decoder V block 1714 receive the delayed data from the calculation blocks 1704, 1706, which is time-aligned with the appropriate LO clocks provided by the multiplexers 1708, 1710. For example, the column decoder U block 1712 and the column decoder V block 1714 may receive the time-aligned delayed digital data in a manner as shown and discussed herein with reference to FIG. 5.

As data is received by the column decoder U block 1712 and the column decoder V block 1714, aspects include the synchronize block 1716 generating the LO and LO_n signals to the appropriate columns of the RF-DAC 1722 in accordance with the time-aligned digital data to be transmitted. Furthermore, aspects include the line decoder U 1718 and the line decoder V 1720 utilizing the least significant bit from the U and V data supplied to the column decoder U block 1712 and the column decoder V block 1714 to calculate the enable pulses to each RF-DAC unit cell to which the LO and LO_n signals are provided, as discussed herein with reference to FIGS. 14A-C.

In other words, the RF-DAC 1722 may be implemented as several hundred or thousand individual RF-DAC unit cells, such as RF-FDAC unit cell 1402, for example, as shown in FIGS. 14A-B. The generated data and clock signals with the appropriate phases are fed to the RF-DAC 1722 to appropriately modulate the transmitted signal in accordance with the delayed I/Q data (e.g., the n1 and n2 component data as discussed herein, or alternatively the U and V data as shown in FIG. 17). The output signal of the RF-DAC 1722 may be coupled to one or more antennas (or power amplifiers that are in turn coupled to antennas) via block 1724 to facilitate data transmission, which may further include, for example, one or more resonant circuits, impedance matching components, etc.

Each unit cell of the RF-DAC 1722, therefore, generates an output signal for each phase (e.g., the LO and the LO_n signal phases) as well as the 180 degree shifted signal, as discussed above. Because the output of each RF-DAC unit cell is coupled in a manner to sum these signals, the additive nature of this operation compensates for the shift in time introduced via the 180 degree phase-shift.

This concept described herein regarding the compensation of the phase or time shift is not limited to capacitive RF-DACs, and may be adapted to any suitable type of RF-DAC implementation. For instance, the concepts discussed herein may also be applicable to current source or resistive DACs.

Examples

The following examples pertain to further aspects.

Example 1 is a digital front end (DFE) configured to operate using multiple phases based upon multiple local oscillator (LO) signals, the DFE comprising: data delay and upsampling circuitry configured to generate a set of in-phase (I) and quadrature-phase (Q) data samples; a set of I multiplexers configured to selectively output a subset of the I data samples based upon a constellation segment location occupied by a data point corresponding to the I and Q data samples; a set of Q multiplexers configured to selectively output a subset of the Q data samples based upon the constellation segment location, wherein the subset of the I data samples and the subset of the Q data samples are utilized to calculate vector component data defining a location of the data point within the constellation; and a radio-frequency digital-to analog converter (RF-DAC) configured to receive the vector component data time-aligned with one or more of the LO signals to facilitate transmission of data represented by the subset of the I data samples and the subset of the Q data samples.

In Example 2, the subject matter of Example 1, wherein the data delay and upsampling circuitry is further configured to generate (i) the set of I data samples having a different data delay with respect to one another, and (ii) the set of Q data samples have a different data delay with respect to one another.

In Example 3, the subject matter of one or more of Examples 1-2, wherein the data delay and upsampling circuitry is further configured to introduce the data delay into the set of I and Q data samples at the baseband rate prior to upsampling.

In Example 4, the subject matter of one or more of Examples 1-3, wherein the data delay and upsampling circuitry is further configured to introduce the data delay into the set of I and Q data samples with respect to a period $T_C$ of a carrier frequency $f_c$ associated with a signal to be transmitted.

In Example 5, the subject matter of one or more of Examples 1-4, wherein the set of I multiplexers includes a first I multiplexer and a second I multiplexer, the first I multiplexer being configured to selectively provide (i) I data samples without a delay, or (ii) I data samples having a first delay, and the second I multiplexer being configured to selectively provide (i) I data samples having a second delay, or (ii) I data samples having a third delay.

In Example 6, the subject matter of one or more of Examples 1-5, wherein the set of Q multiplexers includes a first Q multiplexer and a second Q multiplexer, the first Q multiplexer being configured to selectively provide (i) Q data samples without a delay, or (ii) Q data samples having a first delay, and the second Q multiplexer being configured to selectively provide (i) Q data samples having a second delay, or (ii) Q data samples having a third delay.

In Example 7, the subject matter of one or more of Examples 1-6, wherein: the first delay associated with the I and Q data samples is a delay of $$\frac{1}{4}T_c,$$

with $T_C$ representing a period $T_C$ of a carrier frequency $f_c$ associated with a signal to be transmitted; the second delay associated with the I and Q data samples is a delay of $$\frac{1}{8}T_c;$$

and the third delay associated with the I and Q data samples is a delay of $$\frac{3}{8}T_c.$$

In Example 8, the subject matter of one or more of Examples 1-7, wherein the vector component data defines the location of the data point within the constellation via a first and a second vector component, the DFE further comprising: first vector component calculation circuitry configured to calculate the first vector component based upon the I data samples selectively provided by the first I multiplexer and the Q data samples selectively provided by the first Q multiplexer; and second component calculation circuitry configured to calculate the second vector component based upon the I data samples selectively provided by the second I multiplexer and the Q data samples selectively provided by the second Q multiplexer.

In Example 9, the subject matter of one or more of Examples 1-8, wherein the RF-DAC includes a plurality of unit cells, each unit cell from among the plurality of unit cells being configured as two separate halves, with each half of the unit cell receiving each of the one or more of the LO signals.

In Example 10, the subject matter of one or more of Examples 1-9, wherein each half of the unit cell from among the plurality of unit cells is configured to provide, when enabled in accordance with the received vector component data, each of the one or more of the LO signals out of phase with one another by 180 degrees.

In Example 11, the subject matter of one or more of Examples 1-10, wherein: the one or more of the LO signals include a first and a second LO signal, the RF-DAC includes a plurality of unit cells, each unit cell from among the plurality of unit cells being configured as two separate halves, with each half of the unit cell including: a first AND logic gate having (i) a first input associated with the first LO signal, and (ii) a second input associated with a first enable line configured to have one of two different logic states, a second AND logic gate having (i) a first input associated with the second LO signal, and (ii) a second input associated with a second enable line configured to have one of two different logic states.

Example 12 is a digital front end (DFE) configured to operate using multiple phases based upon multiple local oscillator (LO) signals, the DFE comprising: I data delay circuitry configured to generate, from upsampled in-phase (I) baseband data, a set of I data-delayed samples having a different data delay with respect to one another; Q data delay circuitry configured to generate, from upsampled quadrature-phase (Q) baseband data, a set of Q data-delayed samples having a different data delay with respect to one another; a set of I multiplexers configured to selectively output a subset of the I data-delayed samples based upon a constellation segment location occupied by a data point corresponding to the upsampled I and Q data samples; and a set of Q multiplexers configured to selectively output a subset of the Q data samples based upon the constellation segment location, wherein the subset of the upsampled I data samples and the subset of the upsampled Q data samples are utilized to calculate vector component data defining a location of the data point within the constellation; and a radio-frequency digital-to analog converter (RF-DAC) configured to receive the vector component data time-aligned with one or more of the LO signals to facilitate transmission of data represented by the subset of the upsampled I data samples and the subset of the upsampled Q data samples.

In Example 13, the subject matter of Example 12, wherein each of the I data delay circuitry and the Q data delay circuitry is further configured to introduce the data delay into the upsampled I data samples and the upsampled Q data samples as fractions of a radio frequency (RF) cycle.

In Example 14, the subject matter of one or more of Examples 12-13, wherein each of the I data delay circuitry and the Q data delay circuitry is further configured to introduce the data delay into the upsampled I data samples and the upsampled Q data samples utilizing a bit-shift operation.

In Example 15, the subject matter of one or more of Examples 12-14, wherein the set of I multiplexers includes a first I multiplexer and a second I multiplexer, the first I multiplexer being configured to selectively provide (i) I data samples without a delay, or (ii) I data samples having a first delay, and the second I multiplexer being configured to selectively provide (i) I data samples having a second delay, or (ii) I data samples having a third delay.

In Example 16, the subject matter of one or more of Examples 12-15, wherein the set of Q multiplexers includes a first Q multiplexer and a second Q multiplexer, the first Q multiplexer being configured to selectively provide (i) Q data samples without a delay, or (ii) Q data samples having a first delay, and the second Q multiplexer being configured to selectively provide (i) Q data samples having a second delay, or (ii) Q data samples having a third delay.

In Example 17, the subject matter of one or more of Examples 12-16, wherein: the first delay associated with the I and Q data samples is a delay of one-quarter of a radio frequency (RF) cycle associated with a signal to be transmitted; the second delay associated with the I and Q data samples is a delay of one-eighth of the RF cycle; and the third delay associated with the I and Q data samples is three-eighths of the RF cycle.

In Example 18, the subject matter of one or more of Examples 12-17, wherein the vector component data defines the location of the data point within the constellation via a first and a second vector component, the DFE further comprising: first vector component calculation circuitry configured to calculate the first vector component based upon the I data samples selectively provided by the first I multiplexer and the Q data samples selectively provided by the first Q multiplexer; and second vector component calculation circuitry configured to calculate the second vector component based upon the I data samples selectively provided by the second I multiplexer and the Q data samples selectively provided by the second Q multiplexer.

In Example 19, the subject matter of one or more of Examples 12-18, wherein the RF-DAC is includes a plurality of unit cells, each unit cell from among the plurality of unit cells being configured as two separate halves, with each half of the unit cell receiving each of the one or more of the LO signals.

In Example 20, the subject matter of one or more of Examples 12-19, wherein each half of the unit cell from among the plurality of unit cells is configured to provide, when enabled in accordance with the received vector component data, each of the one or more of the LO signals out of phase with one another by 180 degrees.

In Example 21, the subject matter of one or more of Examples 12-20, wherein: the one or more of the LO signals include a first and a second LO signal, the RF-DAC includes a plurality of unit cells, each unit cell from among the plurality of unit cells being configured as two separate halves, with each half of the unit cell including: a first AND logic gate having (i) a first input associated with the first LO signal, and (ii) a second input associated with a first enable line configured to have one of two different logic states, a second AND logic gate having (i) a first input associated with the second LO signal, and (ii) a second input associated with a second enable line configured to have one of two different logic states.

Example 22 is a wireless device configured to operate using multiple phases based upon multiple local oscillator (LO) signals, comprising: a transmit chain; processing circuitry; and a memory configured to store executable instructions that, when executed by the processing circuitry, causes the transmit chain to: generate a set of in-phase (I) and quadrature-phase (Q) data samples, the set of I data samples having a different data delay with respect to one another, and the set of Q data samples having a different data delay with respect to one another; selectively output a subset of the I data samples and a subset of the Q data samples based upon a constellation segment location occupied by a data point corresponding to the I and Q data samples; calculate vector component data defining a location of the data point within the constellation based upon a subset of the I data samples and the subset of the Q data samples; and transmit data represented by the subset of the I data samples and the subset of the Q data samples by time-aligning the vector component data with one or more of the LO signals.

In Example 23, the subject matter of Example 22, wherein transmit chain is further configured to introduce the data delay into the set of I and Q data samples at a baseband rate prior to generating the set of I and Q data samples.

In Example 24, the subject matter of one or more of Examples 22-23, wherein: the transmit chain includes a radio-frequency digital-to analog converter (RF-DAC) configured to receive the vector component data time-aligned with the one or more of the LO signals, the RF-DAC includes a plurality of unit cells, each unit cell from among the plurality of unit cells being configured as two separate halves, with each half of the unit cell receiving each of the one or more of the LO signals, and each half of the unit cell from among the plurality of unit cells is configured to provide, when enabled in accordance with the received vector component data, each of the one or more of the LO signals out of phase with one another by 180 degrees.

Example 25 is a digital front end (DFE) means for operating using multiple phases based upon multiple local oscillator (LO) signals, the DFE means comprising: data delay and upsampling means for generating a set of in-phase (I) and quadrature-phase (Q) data samples; a set of I multiplexer means for selectively outputting a subset of the I data samples based upon a constellation segment location occupied by a data point corresponding to the I and Q data samples; a set of Q multiplexer means for selectively outputting a subset of the Q data samples based upon the constellation segment location, wherein the subset of the I data samples and the subset of the Q data samples are utilized to calculate vector component data defining a location of the data point within the constellation; and a radio-frequency digital-to analog converter (RF-DAC) means for receiving the vector component data time-aligned with one or more of the LO signals to facilitate transmission of data represented by the subset of the I data samples and the subset of the Q data samples.

In Example 26, the subject matter of Example 25, wherein the data delay and upsampling means further generates (i) the set of I data samples having a different data delay with respect to one another, and (ii) the set of Q data samples have a different data delay with respect to one another.

In Example 27, the subject matter of one or more of Examples 25-26, wherein the data delay and upsampling means further introduces the data delay into the set of I and Q data samples at the baseband rate prior to upsampling.

In Example 28, the subject matter of one or more of Examples 25-27, wherein the data delay and upsampling means further introduces the data delay into the set of I and Q data samples with respect to a period $T_C$ of a carrier frequency $f_c$ associated with a signal to be transmitted.

In Example 29, the subject matter of one or more of Examples 25-28, wherein the set of I multiplexers includes a first I multiplexer and a second I multiplexer, the first I multiplexer being configured to selectively provide (i) I data samples without a delay, or (ii) I data samples having a first delay, and the second I multiplexer being configured to selectively provide (i) I data samples having a second delay, or (ii) I data samples having a third delay.

In Example 30, the subject matter of one or more of Examples 25-29, wherein the set of Q multiplexer means includes a first Q multiplexer and a second Q multiplexer, the first Q multiplexer means selectively providing (i) Q data samples without a delay, or (ii) Q data samples having a first delay, and the second Q multiplexer means selectively providing (i) Q data samples having a second delay, or (ii) Q data samples having a third delay.

In Example 31, the subject matter of one or more of Examples 25-30, wherein: the first delay associated with the I and Q data samples is a delay of $$\frac{1}{4}T_C,$$

with $T_C$ representing a period $T_C$ of a carrier frequency $f_c$ associated with a signal to be transmitted; the second delay associated with the I and Q data samples is a delay of $$\frac{1}{8}T_C;$$

and the third delay associated with the I and Q data samples is a delay of $$\frac{3}{8}T_C.$$

In Example 32, the subject matter of one or more of Examples 25-31, wherein the vector component data defines the location of the data point within the constellation via a first and a second vector component, the DFE means further comprising: first vector component calculation means for calculating the first vector component based upon the I data samples selectively provided by the first I multiplexer and the Q data samples selectively provided by the first Q multiplexer; and second component calculation means for calculating the second vector component based upon the I data samples selectively provided by the second I multiplexer and the Q data samples selectively provided by the second Q multiplexer.

In Example 33, the subject matter of one or more of Examples 25-32, wherein the RF-DAC means includes a plurality of unit cells, each unit cell from among the plurality of unit cells being configured as two separate halves, with each half of the unit cell receiving each of the one or more of the LO signals.

In Example 34, the subject matter of one or more of Examples 25-33, wherein each half of the unit cell from among the plurality of unit cells is configured to provide, when enabled in accordance with the received vector component data, each of the one or more of the LO signals out of phase with one another by 180 degrees.

In Example 35, the subject matter of one or more of Examples 25-34, wherein: the one or more of the LO signals include a first and a second LO signal, the RF-DAC means includes a plurality of unit cells, each unit cell from among the plurality of unit cells being configured as two separate halves, with each half of the unit cell including: a first AND logic gate having (i) a first input associated with the first LO signal, and (ii) a second input associated with a first enable line configured to have one of two different logic states, a second AND logic gate having (i) a first input associated with the second LO signal, and (ii) a second input associated with a second enable line configured to have one of two different logic states.

Example 36 is a digital front end (DFE) means for operating using multiple phases based upon multiple local oscillator (LO) signals, the DFE means comprising: I data delay means for generating, from upsampled in-phase (I) baseband data, a set of I data-delayed samples having a different data delay with respect to one another; Q data delay means for generating, from upsampled quadrature-phase (Q) baseband data, a set of Q data-delayed samples having a different data delay with respect to one another; a set of I multiplexer means for selectively outputting a subset of the I data-delayed samples based upon a constellation segment location occupied by a data point corresponding to the upsampled I and Q data samples; and a set of Q multiplexer means for selectively outputting a subset of the Q data samples based upon the constellation segment location, wherein the subset of the upsampled I data samples and the subset of the upsampled Q data samples are utilized to calculate vector component data defining a location of the data point within the constellation; and a radio-frequency digital-to analog converter (RF-DAC) means for receiving the vector component data time-aligned with one or more of the LO signals to facilitate transmission of data represented by the subset of the upsampled I data samples and the subset of the up sampled Q data samples.

In Example 37, the subject matter of Example 36, wherein each of the I data delay means and the Q data delay means further introduce the data delay into the upsampled I data samples and the upsampled Q data samples as fractions of a radio frequency (RF) cycle.

In Example 38, the subject matter of one or more of Examples 36-37, wherein each of the I data delay means and the Q data delay means further introduce the data delay into the upsampled I data samples and the upsampled Q data samples utilizing a bit-shift operation.

In Example 39, the subject matter of one or more of Examples 36-38, wherein the set of I multiplexer means includes a first I multiplexer means and a second I multiplexer means, the first I multiplexer means selectively providing (i) I data samples without a delay, or (ii) I data samples having a first delay, and the second I multiplexer means selectively providing (i) I data samples having a second delay, or (ii) I data samples having a third delay.

In Example 40, the subject matter of one or more of Examples 36-39, wherein the set of Q multiplexer means include a first Q multiplexer means and a second Q multiplexer means, the first Q multiplexer means selectively providing (i) Q data samples without a delay, or (ii) Q data samples having a first delay, and the second Q multiplexer means selectively providing (i) Q data samples having a second delay, or (ii) Q data samples having a third delay.

In Example 41, the subject matter of one or more of Examples 36-40, wherein: the first delay associated with the I and Q data samples is a delay of one-quarter of a radio frequency (RF) cycle associated with a signal to be transmitted; the second delay associated with the I and Q data samples is a delay of one-eighth of the RF cycle; and the third delay associated with the I and Q data samples is three-eighths of the RF cycle.

In Example 42, the subject matter of one or more of Examples 36-41, wherein the vector component data defines the location of the data point within the constellation via a first and a second vector component, the DFE means further comprising: first vector component calculation means for calculating the first vector component based upon the I data samples selectively provided by the first I multiplexer and the Q data samples selectively provided by the first Q multiplexer; and second vector component calculation means for calculating the second vector component based upon the I data samples selectively provided by the second I multiplexer means and the Q data samples selectively provided by the second Q multiplexer means.

In Example 43, the subject matter of one or more of Examples 36-42, wherein the RF-DAC means includes a plurality of unit cells, each unit cell from among the plurality of unit cells being configured as two separate halves, with each half of the unit cell receiving each of the one or more of the LO signals.

In Example 44, the subject matter of one or more of Examples 36-43, wherein each half of the unit cell from among the plurality of unit cells is configured to provide, when enabled in accordance with the received vector component data, each of the one or more of the LO signals out of phase with one another by 180 degrees.

In Example 45, the subject matter of one or more of Examples 36-44, wherein: the one or more of the LO signals include a first and a second LO signal, the RF-DAC means includes a plurality of unit cells, each unit cell from among the plurality of unit cells being configured as two separate halves, with each half of the unit cell including: a first AND logic gate having (i) a first input associated with the first LO signal, and (ii) a second input associated with a first enable line configured to have one of two different logic states, a second AND logic gate having (i) a first input associated with the second LO signal, and (ii) a second input associated with a second enable line configured to have one of two different logic states.

Example 46 is a wireless device means for operating using multiple phases based upon multiple local oscillator (LO) signals, comprising: a transmit chain means; processing circuitry means; and a memory means for storing executable instructions that, when executed by the processing circuitry means, causes the transmit chain means to: generate a set of in-phase (I) and quadrature-phase (Q) data samples, the set of I data samples having a different data delay with respect to one another, and the set of Q data samples having a different data delay with respect to one another; selectively output a subset of the I data samples and a subset of the Q data samples based upon a constellation segment location occupied by a data point corresponding to the I and Q data samples; calculate vector component data defining a location of the data point within the constellation based upon a subset of the I data samples and the subset of the Q data samples; and transmit data represented by the subset of the I data samples and the subset of the Q data samples by time-aligning the vector component data with one or more of the LO signals.

In Example 47, the subject matter of Example 46, wherein transmit chain means further introduces the data delay into the set of I and Q data samples at a baseband rate prior to generating the set of I and Q data samples.

In Example 48, the subject matter of one or more of Examples 46-47, wherein: the transmit chain means includes a radio-frequency digital-to analog converter (RF-DAC) means for receiving the vector component data time-aligned with the one or more of the LO signals, the RF-DAC means including a plurality of unit cells, each unit cell from among the plurality of unit cells being configured as two separate halves, with each half of the unit cell receiving each of the one or more of the LO signals, and each half of the unit cell from among the plurality of unit cells is configured to provide, when enabled in accordance with the received vector component data, each of the one or more of the LO signals out of phase with one another by 180 degrees.

An apparatus as shown and described.

A method as shown and described.

CONCLUSION

The aforementioned description of the specific aspects will so fully reveal the general nature of the disclosure that others can, by applying knowledge within the skill of the art, readily modify and/or adapt for various applications such specific aspects, without undue experimentation, and without departing from the general concept of the present disclosure. Therefore, such adaptations and modifications are intended to be within the meaning and range of equivalents of the disclosed aspects, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

References in the specification to "one aspect," "an aspect," "an exemplary aspect," etc., indicate that the aspect described may include a particular feature, structure, or characteristic, but every aspect may not necessarily include the particular feature, structure, or characteristic. Moreover, such phrases are not necessarily referring to the same aspect. Further, when a particular feature, structure, or characteristic is described in connection with an aspect, it is submitted that it is within the knowledge of one skilled in the art to affect such feature, structure, or characteristic in connection with other aspects whether or not explicitly described.

The exemplary aspects described herein are provided for illustrative purposes, and are not limiting. Other exemplary aspects are possible, and modifications may be made to the exemplary aspects. Therefore, the specification is not meant to limit the disclosure. Rather, the scope of the disclosure is defined only in accordance with the following claims and their equivalents.

Aspects may be implemented in hardware (e.g., circuits), firmware, software, or any combination thereof. Aspects may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

For the purposes of this discussion, the term "processing circuitry" or "processor circuitry" shall be understood to be circuit(s), processor(s), logic, or a combination thereof. For example, a circuit can include an analog circuit, a digital circuit, state machine logic, other structural electronic hardware, or a combination thereof. A processor can include a microprocessor, a digital signal processor (DSP), or other hardware processor. The processor can be "hard-coded" with instructions to perform corresponding function(s) according to aspects described herein. Alternatively, the processor can access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary aspects described herein, processing circuitry can include memory that stores data and/or instructions. The memory can be any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

What is claimed is:

1. A digital front end (DFE) configured to operate using multiple phases based upon multiple local oscillator (LO) signals, the DFE comprising:
    data delay and upsampling circuitry configured to generate a set of in-phase (I) and a set of quadrature-phase (Q) data samples,
    wherein a data delay is introduced into the set of I data samples and the set of Q data samples such that each of the set of I data samples has a different data delay with respect to one another and each of the set of Q data samples has a different data delay with respect to one another;
    a set of I multiplexers configured to selectively output a subset of the I data samples having respective data delays based upon a constellation segment location occupied by a data point corresponding to the I and Q data samples;
    a set of Q multiplexers configured to selectively output a subset of the Q data samples having respective data delays based upon the constellation segment location occupied by the data point,
    wherein the subset of the I data samples and the subset of the Q data samples are utilized to calculate vector component data defining a re-mapped location of the data point within the constellation; and
    a radio-frequency digital-to-analog converter (RF-DAC) configured to receive the vector component data having, for each I and Q component of the re-mapped location of the data point, a data delay that is time-aligned with a respective one of the multiple LO signals in accordance with one of the different data delays introduced into the set of I data samples and the set of Q data samples to facilitate transmission of data represented by the subset of the I data samples and the subset of the Q data samples.

2. The DFE of claim 1, wherein the data delay associated with each of the set of I data samples and the set of Q data samples is proportional to a fraction of a period associated with one of a baseband data rate or a radio frequency (RF) data rate that is used for signal transmission, the fraction of the period being based upon a number of constellation segments associated with the constellation segment location occupied by the data point.

3. The DFE of claim 1, wherein the data delay and upsampling circuitry is further configured to introduce the data delay into the set of I and Q data samples at the baseband rate prior to upsampling.

4. The DFE of claim 1, wherein the data delay and upsampling circuitry is further configured to introduce the data delay into the set of I and Q data samples with respect to a period $T_C$ of a carrier frequency $f_c$ associated with a signal to be transmitted.

5. The DFE of claim 1, wherein the set of I multiplexers includes a first I multiplexer and a second I multiplexer, the first I multiplexer being configured to selectively provide (i) I data samples without a delay, or (ii) I data samples having a first delay, and the second I multiplexer being configured to selectively provide (i) I data samples having a second delay, or (ii) I data samples having a third delay.

6. The DFE of claim 5, wherein the set of Q multiplexers includes a first Q multiplexer and a second Q multiplexer, the first Q multiplexer being configured to selectively provide (i) Q data samples without a delay, or (ii) Q data samples having a first delay, and the second Q multiplexer being configured to selectively provide (i) Q data samples having a second delay, or (ii) Q data samples having a third delay.

7. The DFE of claim 6, wherein:
    the first delay associated with the I and Q data samples is a delay of $$\frac{1}{4}T_c,$$

with $T_C$ representing a period $T_C$ of a carrier frequency $f_c$ associated with a signal to be transmitted;
    the second delay associated with the I and Q data samples is a delay of $$\frac{1}{8}T_c;$$

and
    the third delay associated with the I and Q data samples is a delay of $$\frac{3}{8}T_c.$$

8. The DFE of claim 6, wherein the vector component data defines the location of the data point within the constellation via a first and a second vector component, the DFE further comprising:

first vector component calculation circuitry configured to calculate the first vector component based upon the I data samples selectively provided by the first I multiplexer and the Q data samples selectively provided by the first Q multiplexer; and second vector component calculation circuitry configured to calculate the second vector component based upon the I data samples selectively provided by the second I multiplexer and the Q data samples selectively provided by the second Q multiplexer.

9. The DFE of claim 1, wherein the RF-DAC includes a plurality of unit cells, each unit cell from among the plurality of unit cells being configured as two separate halves, with each half of the unit cell receiving each of the one or more of the LO signals.

10. The DFE of claim 9, wherein each half of the unit cell from among the plurality of unit cells is configured to provide, when enabled in accordance with the received vector component data, each of the one or more of the LO signals out of phase with one another by 180 degrees.

11. The DFE of claim 1, wherein:
the one or more of the LO signals include a first and a second LO signal,
the RF-DAC includes a plurality of unit cells, each unit cell from among the plurality of unit cells being configured as two separate halves, with each half of the unit cell including:
a first AND logic gate having (i) a first input associated with the first LO signal, and (ii) a second input associated with a first enable line configured to have one of two different logic states,
a second AND logic gate having (i) a first input associated with the second LO signal, and (ii) a second input associated with a second enable line configured to have one of two different logic states.

12. A digital front end (DFE) configured to operate using multiple phases based upon multiple local oscillator (LO) signals, the DFE comprising:
I data delay circuitry configured to generate, from upsampled in-phase (I) baseband data, a set of I data-delayed samples having a different data delay with respect to one another;
Q data delay circuitry configured to generate, from upsampled quadrature-phase (Q) baseband data, a set of Q data-delayed samples having a different data delay with respect to one another;
a set of I multiplexers configured to selectively output a subset of the I data-delayed samples having respective data delays based upon a constellation segment location occupied by a data point corresponding to the upsampled I and Q data samples; and
a set of Q multiplexers configured to selectively output a subset of the Q data samples having respective data delays based upon the constellation segment location occupied by the data point,
wherein the subset of the upsampled I data samples and the subset of the upsampled Q data samples are utilized to calculate vector component data defining a re-mapped location of the data point within the constellation; and
a radio-frequency digital-to-analog converter (RF-DAC) configured to receive the vector component data having, for each I and Q component of the data point, a data delay that is time-aligned with a respective one of the multiple LO signals to facilitate transmission of data represented by the subset of the upsampled I data samples and the subset of the up sampled Q data samples.

13. The DFE of claim 12, wherein each of the I data delay circuitry and the Q data delay circuitry is further configured to introduce the data delay into the upsampled I data samples and the upsampled Q data samples as fractions of a radio frequency (RF) cycle.

14. The DFE of claim 12, wherein each of the I data delay circuitry and the Q data delay circuitry is further configured to introduce the data delay into the upsampled I data samples and the upsampled Q data samples utilizing a bit-shift operation.

15. The DFE of claim 12, wherein the set of I multiplexers includes a first I multiplexer and a second I multiplexer, the first I multiplexer being configured to selectively provide (i) I data samples without a delay, or (ii) I data samples having a first delay, and the second I multiplexer being configured to selectively provide (i) I data samples having a second delay, or (ii) I data samples having a third delay.

16. The DFE of claim 15, wherein the set of Q multiplexers includes a first Q multiplexer and a second Q multiplexer, the first Q multiplexer being configured to selectively provide (i) Q data samples without a delay, or (ii) Q data samples having a first delay, and the second Q multiplexer being configured to selectively provide (i) Q data samples having a second delay, or (ii) Q data samples having a third delay.

17. The DFE of claim 16, wherein:
the first delay associated with the I and Q data samples is a delay of one-quarter of a radio frequency (RF) cycle associated with a signal to be transmitted;
the second delay associated with the I and Q data samples is a delay of one-eighth of the RF cycle; and
the third delay associated with the I and Q data samples is three-eighths of the RF cycle.

18. The DFE of claim 16, wherein the vector component data defines the location of the data point within the constellation via a first and a second vector component, the DFE further comprising:
first vector component calculation circuitry configured to calculate the first vector component based upon the I data samples selectively provided by the first I multiplexer and the Q data samples selectively provided by the first Q multiplexer; and
second vector component calculation circuitry configured to calculate the second vector component based upon the I data samples selectively provided by the second I multiplexer and the Q data samples selectively provided by the second Q multiplexer.

19. The DFE of claim 12, wherein the RF-DAC is includes a plurality of unit cells, each unit cell from among the plurality of unit cells being configured as two separate halves, with each half of the unit cell receiving each of the one or more of the LO signals.

20. The DFE of claim 19, wherein each half of the unit cell from among the plurality of unit cells is configured to provide, when enabled in accordance with the received vector component data, each of the one or more of the LO signals out of phase with one another by 180 degrees.

21. The DFE of claim 12, wherein:
the one or more of the LO signals include a first and a second LO signal,
the RF-DAC includes a plurality of unit cells, each unit cell from among the plurality of unit cells being configured as two separate halves, with each half of the unit cell including:

a first AND logic gate having (i) a first input associated with the first LO signal, and (ii) a second input associated with a first enable line configured to have one of two different logic states, a second AND logic gate having (i) a first input associated with the second LO signal, and (ii) a second input associated with a second enable line configured to have one of two different logic states.

22. A wireless device configured to operate using multiple phases based upon multiple local oscillator (LO) signals, comprising:

a transmit chain;

processing circuitry; and a memory configured to store executable instructions that, when executed by the processing circuitry, causes the transmit chain to:

generate a set of in-phase (I) and quadrature-phase (Q) data samples, the set of I data samples having a different data delay with respect to one another, and the set of Q data samples having a different data delay with respect to one another;

selectively output a subset of the I data samples and a subset of the Q data samples having respective data delays based upon a constellation segment location occupied by a data point corresponding to the I and Q data samples;

calculate vector component data defining a re-mapped location of the data point within the constellation based upon the subset of the I data samples and the subset of the Q data samples; and transmit data represented by the subset of the I data samples and the subset of the Q data samples by time-aligning each I and Q component of the re-mapped location of the data point associated with the vector component data with a respective one of the multiple LO signals.

23. The wireless device of claim 22, wherein transmit chain is further configured to introduce the data delay into the set of I and Q data samples at a baseband rate prior to generating the set of I and Q data samples.

24. The wireless device of claim 22, wherein:

the transmit chain includes a radio-frequency digital-to analog converter (RF-DAC) configured to receive the vector component data time-aligned with the one or more of the LO signals, the RF-DAC includes a plurality of unit cells, each unit cell from among the plurality of unit cells being configured as two separate halves, with each half of the unit cell receiving each of the one or more of the LO signals, and each half of the unit cell from among the plurality of unit cells is configured to provide, when enabled in accordance with the received vector component data, each of the one or more of the LO signals out of phase with one another by 180 degrees.

* * * * *